United States Patent
Acar

(10) Patent No.: US 10,050,155 B2
(45) Date of Patent: Aug. 14, 2018

(54) MICROMACHINED MONOLITHIC 3-AXIS GYROSCOPE WITH SINGLE DRIVE

(71) Applicant: Fairchild Semiconductor Corporation, San Jose, CA (US)

(72) Inventor: Cenk Acar, Newport Coast, CA (US)

(73) Assignee: Fairchild Semiconductor Corporation, Phoenix, AZ (US)

( * ) Notice: Subject to any disclaimer, the term of this patent is extended or adjusted under 35 U.S.C. 154(b) by 166 days.

(21) Appl. No.: 15/005,783

(22) Filed: Jan. 25, 2016

(65) Prior Publication Data

US 2016/0264404 A1  Sep. 15, 2016

Related U.S. Application Data

(63) Continuation of application No. 13/821,842, filed as application No. PCT/US2011/052065 on Sep. 18, 2011, now Pat. No. 9,246,018.
(Continued)

(51) Int. Cl.
*G01P 21/02* (2006.01)
*H01L 29/84* (2006.01)
(Continued)

(52) U.S. Cl.
CPC ............... *H01L 29/84* (2013.01); *B81B 7/04* (2013.01); *G01C 19/5755* (2013.01);
(Continued)

(58) Field of Classification Search
CPC ... H01L 29/84; G01C 19/5755; G01P 15/125; G01P 15/18; G01P 2015/0848;
(Continued)

(56) References Cited

U.S. PATENT DOCUMENTS 3,231,729 A   1/1966 Stern
4,511,848 A   4/1985 Watson
(Continued)

FOREIGN PATENT DOCUMENTS

CN   1068444 A   1/1993
CN   1198587 A   11/1998
(Continued)

OTHER PUBLICATIONS

Translation of DE 102009001244 A1 (please see US PGPUB 2012/0048017 as translation).*
(Continued)

*Primary Examiner* — Lisa Caputo
*Assistant Examiner* — Nathaniel T Woodward
(74) *Attorney, Agent, or Firm* — Brake Hughes Bellermann LLP

(57) ABSTRACT

This document discusses, among other things, a cap wafer and a via wafer configured to encapsulate a single proof-mass 3-axis gyroscope formed in an x-y plane of a device layer. The single proof-mass 3-axis gyroscope can include a main proof-mass section suspended about a single, central anchor, the main proof-mass section including a radial portion extending outward towards an edge of the 3-axis gyroscope sensor, a central suspension system configured to suspend the 3-axis gyroscope from the single, central anchor, and a drive electrode including a moving portion and a stationary portion, the moving portion coupled to the radial portion, wherein the drive electrode and the central suspension system are configured to oscillate the 3-axis gyroscope about a z-axis normal to the x-y plane at a drive frequency.

20 Claims, 10 Drawing Sheets

Related U.S. Application Data

(60) Provisional application No. 61/384,245, filed on Sep. 18, 2010, provisional application No. 61/384,246, filed on Sep. 18, 2010.

(51) Int. Cl.
 *G01C 19/5755* (2012.01)
 *G01P 15/125* (2006.01)
 *G01P 15/18* (2013.01)
 *B81B 7/04* (2006.01)
 *G01P 15/08* (2006.01)

(52) U.S. Cl.
 CPC ............ *G01P 15/125* (2013.01); *G01P 15/18* (2013.01); *B81B 2201/0235* (2013.01); *B81B 2201/0242* (2013.01); *B81B 2203/051* (2013.01); *B81B 2203/053* (2013.01); *B81B 2203/055* (2013.01); *B81B 2203/056* (2013.01); *B81B 2203/058* (2013.01); *B81B 2207/094* (2013.01); *G01P 2015/0848* (2013.01)

(58) Field of Classification Search
 CPC .............. B81B 7/04; B81B 2201/0235; B81B 2201/0242; B81B 2203/051; B81B 2203/053; B81B 2203/055; B81B 2203/056; B81B 2203/058; B81B 2207/094
 USPC .......................................................... 73/1.37
 See application file for complete search history.

(56) References Cited

U.S. PATENT DOCUMENTS

| | | | |
|---|---|---|---|
| 4,896,156 A | | 1/1990 | Garverick |
| 5,481,914 A | | 1/1996 | Ward |
| 5,487,305 A | * | 1/1996 | Ristic ................... G01P 15/125 73/514.18 |
| 5,491,604 A | | 2/1996 | Nguyen et al. |
| 5,600,064 A | | 2/1997 | Ward |
| 5,656,778 A | | 8/1997 | Roszhart |
| 5,659,195 A | | 8/1997 | Kaiser et al. |
| 5,703,292 A | | 12/1997 | Ward |
| 5,723,790 A | | 3/1998 | Andersson |
| 5,751,154 A | | 5/1998 | Tsugai |
| 5,760,465 A | | 6/1998 | Alcoe et al. |
| 5,765,046 A | | 6/1998 | Watanabe et al. |
| 5,894,091 A | | 4/1999 | Kubota |
| 5,912,499 A | | 6/1999 | Diem et al. |
| 5,992,233 A | | 11/1999 | Clark |
| 6,131,457 A | | 10/2000 | Sato |
| 6,214,644 B1 | | 4/2001 | Glenn |
| 6,230,566 B1 | | 5/2001 | Lee et al. |
| 6,236,096 B1 | | 5/2001 | Chang et al. |
| 6,250,157 B1 | | 6/2001 | Touge |
| 6,253,612 B1 | | 7/2001 | Lemkin et al. |
| 6,301,965 B1 | | 10/2001 | Chu et al. |
| 6,351,996 B1 | | 3/2002 | Nasiri et al. |
| 6,366,468 B1 | | 4/2002 | Pan |
| 6,370,937 B2 | | 4/2002 | Hsu |
| 6,390,905 B1 | | 5/2002 | Korovin et al. |
| 6,501,282 B1 | | 12/2002 | Dummermuth et al. |
| 6,504,385 B2 | | 1/2003 | Hartwell |
| 6,516,651 B1 | | 2/2003 | Geen |
| 6,553,835 B1 | | 4/2003 | Hobbs et al. |
| 6,629,448 B1 | | 10/2003 | Cvancara |
| 6,654,424 B1 | | 11/2003 | Thomae et al. |
| 6,664,941 B2 | | 12/2003 | Itakura et al. |
| 6,722,206 B2 | | 4/2004 | Takada |
| 6,725,719 B2 | | 4/2004 | Cardarelli |
| 6,737,742 B2 | | 5/2004 | Sweterlitsch |
| 6,781,231 B2 | | 8/2004 | Minervini et al. |
| 6,848,304 B2 | | 2/2005 | Geen |
| 7,051,590 B1 | 5/2006 | Lemkin et al. |
| 7,054,778 B2 | 5/2006 | Geiger et al. |
| 7,093,487 B2 | 8/2006 | Mochida |
| 7,166,910 B2 | 1/2007 | Minervini et al. |
| 7,173,402 B2 | 2/2007 | Chen et al. |
| 7,187,735 B2 | 3/2007 | Kent et al. |
| 7,202,552 B2 | 4/2007 | Zhe et al. |
| 7,210,351 B2 | 5/2007 | Lo et al. |
| 7,216,525 B2 | 5/2007 | Schroeder |
| 7,221,767 B2 | 5/2007 | Mullenborn et al. |
| 7,240,552 B2 | 7/2007 | Acar et al. |
| 7,258,011 B2 | 8/2007 | Nasiri et al. |
| 7,258,012 B2 | 8/2007 | Xie et al. |
| 7,266,349 B2 | 9/2007 | Kappes |
| 7,293,460 B2 | 11/2007 | Zarabadi et al. |
| 7,301,212 B1 | 11/2007 | Mian et al. |
| 7,305,880 B2 | 12/2007 | Caminada et al. |
| 7,339,384 B2 | 3/2008 | Peng et al. |
| 7,358,151 B2 | 4/2008 | Araki et al. |
| 7,403,756 B1 | 7/2008 | Jiacinto et al. |
| 7,436,054 B2 | 10/2008 | Zhe |
| 7,444,869 B2 | 11/2008 | Johnson et al. |
| 7,449,355 B2 | 11/2008 | Lutz et al. |
| 7,451,647 B2 | 11/2008 | Matsuhisa et al. |
| 7,454,967 B2 | 11/2008 | Skurnik |
| 7,481,110 B2 | 1/2009 | Handrich et al. |
| 7,518,493 B2 | 4/2009 | Bryzek et al. |
| 7,539,003 B2 | 5/2009 | Ray |
| 7,544,531 B1 | 6/2009 | Grosjean |
| 7,565,839 B2 | 7/2009 | Stewart et al. |
| 7,595,648 B2 | 9/2009 | Ungaretti et al. |
| 7,600,428 B2 | 10/2009 | Robert et al. |
| 7,616,078 B2 | 11/2009 | Prandi et al. |
| 7,622,782 B2 | 11/2009 | Chu et al. |
| 7,694,563 B2 | 4/2010 | Durante et al. |
| 7,706,149 B2 | 4/2010 | Yang et al. |
| 7,781,249 B2 | 8/2010 | Laming et al. |
| 7,795,078 B2 | 9/2010 | Ramakrishna et al. |
| 7,817,331 B2 | 10/2010 | Moidu |
| 7,851,925 B2 | 12/2010 | Theuss et al. |
| 7,859,352 B2 | 12/2010 | Sutton |
| 7,950,281 B2 | 5/2011 | Hammerschmidt |
| 7,965,067 B2 | 6/2011 | Grönthal et al. |
| 8,004,354 B1 | 8/2011 | Pu et al. |
| 8,006,557 B2 | 8/2011 | Yin et al. |
| 8,026,771 B2 | 9/2011 | Kanai et al. |
| 8,037,755 B2 | 10/2011 | Nagata et al. |
| 8,113,050 B2 | 2/2012 | Acar et al. |
| 8,171,792 B2 | 5/2012 | Sameshima |
| 8,201,449 B2 | 6/2012 | Ohuchi et al. |
| 8,250,921 B2 | 8/2012 | Nasiri et al. |
| 8,256,290 B2 | 9/2012 | Mao |
| 8,375,789 B2 | 2/2013 | Prandi et al. |
| 8,378,756 B2 | 2/2013 | Huang et al. |
| 8,421,168 B2 | 4/2013 | Allen et al. |
| 8,476,970 B2 | 7/2013 | Mokhtar et al. |
| 8,497,746 B2 | 7/2013 | Visconti et al. |
| 8,508,290 B2 | 8/2013 | Elsayed et al. |
| 8,643,382 B2 | 2/2014 | Steele et al. |
| 8,661,898 B2 | 3/2014 | Watson |
| 8,710,599 B2 | 4/2014 | Marx et al. |
| 8,739,626 B2 | 6/2014 | Acar |
| 8,742,964 B2 | 6/2014 | Kleks et al. |
| 8,754,694 B2 | 6/2014 | Opris et al. |
| 8,763,459 B2 | 7/2014 | Brand et al. |
| 8,813,564 B2 | 8/2014 | Acar |
| 8,978,475 B2 | 3/2015 | Acar |
| 9,003,882 B1 | 4/2015 | Ayazi et al. |
| 9,006,846 B2 | 4/2015 | Bryzek et al. |
| 9,052,335 B2 | 6/2015 | Coronato et al. |
| 9,062,972 B2 | 6/2015 | Acar et al. |
| 9,069,006 B2 | 6/2015 | Opris et al. |
| 9,094,027 B2 | 7/2015 | Tao et al. |
| 9,095,072 B2 | 7/2015 | Bryzek et al. |
| 9,156,673 B2 | 10/2015 | Bryzek et al. |
| 9,246,018 B2 | 1/2016 | Acar |
| 9,278,845 B2 | 3/2016 | Acar |
| 9,278,846 B2 | 3/2016 | Acar |
| 9,352,961 B2 | 5/2016 | Acar et al. |

(56) References Cited

U.S. PATENT DOCUMENTS

| | | |
|---|---|---|
| 9,425,328 B2 | 8/2016 | Marx et al. |
| 9,444,404 B2 | 9/2016 | Opris et al. |
| 9,455,354 B2 | 9/2016 | Acar |
| 9,488,693 B2 | 11/2016 | Kleks et al. |
| 2001/0022106 A1 | 9/2001 | Kato et al. |
| 2002/0021059 A1 | 2/2002 | Knowles et al. |
| 2002/0083757 A1 | 7/2002 | Geen |
| 2002/0117728 A1 | 8/2002 | Brosnihan et al. |
| 2002/0178831 A1 | 12/2002 | Takada |
| 2002/0189352 A1 | 12/2002 | John, III et al. |
| 2002/0196445 A1 | 12/2002 | Mcclary et al. |
| 2003/0033850 A1 | 2/2003 | Challoner et al. |
| 2003/0038415 A1 | 2/2003 | Anderson et al. |
| 2003/0061878 A1 | 4/2003 | Pinson |
| 2003/0196475 A1 | 10/2003 | Wyse |
| 2003/0200807 A1 | 10/2003 | Hulsing, II |
| 2003/0222337 A1 | 12/2003 | Stewart |
| 2004/0051508 A1 | 3/2004 | Hamon et al. |
| 2004/0085096 A1 | 5/2004 | Ward et al. |
| 2004/0085784 A1 | 5/2004 | Salama et al. |
| 2004/0088127 A1 | 5/2004 | M'closkey et al. |
| 2004/0119137 A1 | 6/2004 | Leonardi et al. |
| 2004/0177689 A1 | 9/2004 | Cho |
| 2004/0211258 A1 | 10/2004 | Geen |
| 2004/0219340 A1 | 11/2004 | McNeil et al. |
| 2004/0231420 A1 | 11/2004 | Xie et al. |
| 2004/0251793 A1 | 12/2004 | Matsuhisa |
| 2005/0005698 A1 | 1/2005 | McNeil et al. |
| 2005/0097957 A1 | 5/2005 | Mcneil et al. |
| 2005/0139005 A1 | 6/2005 | Geen |
| 2005/0189635 A1 | 9/2005 | Humpston et al. |
| 2005/0274181 A1 | 12/2005 | Kutsuna et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0097331 A1 | 5/2006 | Hattori et al. |
| 2006/0112764 A1 | 6/2006 | Higuchi |
| 2006/0137457 A1 | 6/2006 | Zdeblick |
| 2006/0141786 A1 | 6/2006 | Boezen et al. |
| 2006/0207328 A1 | 9/2006 | Zarabadi et al. |
| 2006/0213265 A1 | 9/2006 | Weber et al. |
| 2006/0213266 A1 | 9/2006 | French et al. |
| 2006/0213268 A1 | 9/2006 | Asami et al. |
| 2006/0246631 A1 | 11/2006 | Lutz et al. |
| 2006/0283245 A1 | 12/2006 | Konno et al. |
| 2007/0013052 A1 | 1/2007 | Zhe et al. |
| 2007/0034005 A1 | 2/2007 | Acar et al. |
| 2007/0040231 A1 | 2/2007 | Harney et al. |
| 2007/0042606 A1 | 2/2007 | Wang et al. |
| 2007/0047744 A1 | 3/2007 | Karney et al. |
| 2007/0071268 A1 | 3/2007 | Harney et al. |
| 2007/0085544 A1 | 4/2007 | Viswanathan |
| 2007/0099327 A1 | 5/2007 | Hartzell et al. |
| 2007/0113653 A1 | 5/2007 | Nasiri et al. |
| 2007/0114643 A1 | 5/2007 | DCamp et al. |
| 2007/0165888 A1 | 7/2007 | Weigold |
| 2007/0180908 A1 | 8/2007 | Seeger et al. |
| 2007/0205492 A1 | 9/2007 | Wang |
| 2007/0214883 A1* | 9/2007 | Durante ............ G01C 19/5712 73/504.04 |
| 2007/0214891 A1 | 9/2007 | Robert et al. |
| 2007/0220973 A1 | 9/2007 | Acar |
| 2007/0222021 A1 | 9/2007 | Yao |
| 2007/0240486 A1 | 10/2007 | Moore et al. |
| 2007/0284682 A1 | 12/2007 | Laming et al. |
| 2008/0022762 A1 | 1/2008 | Skurnik |
| 2008/0049230 A1 | 2/2008 | Chin et al. |
| 2008/0079120 A1 | 4/2008 | Foster et al. |
| 2008/0079444 A1 | 4/2008 | Denison |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0253057 A1 | 10/2008 | Rijks et al. |
| 2008/0284365 A1 | 11/2008 | Sri-Jayantha et al. |
| 2008/0290756 A1 | 11/2008 | Huang |
| 2008/0302559 A1 | 12/2008 | Leedy |
| 2008/0314147 A1 | 12/2008 | Nasiri et al. |
| 2009/0007661 A1* | 1/2009 | Nasiri .................. G01P 1/023 73/504.03 |
| 2009/0056443 A1 | 3/2009 | Netzer |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0085191 A1 | 4/2009 | Najafi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee |
| 2010/0058864 A1 | 3/2010 | Hsu et al. |
| 2010/0072626 A1 | 3/2010 | Theuss et al. |
| 2010/0077858 A1 | 4/2010 | Kawakubo et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0132461 A1 | 6/2010 | Hauer et al. |
| 2010/0155863 A1 | 6/2010 | Weekamp |
| 2010/0194615 A1 | 8/2010 | Lu |
| 2010/0199764 A1 | 8/2010 | Hammer et al. |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0231452 A1 | 9/2010 | Babakhani et al. |
| 2010/0236327 A1 | 9/2010 | Mao et al. |
| 2010/0263445 A1 | 10/2010 | Hayner et al. |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0074389 A1 | 3/2011 | Knierim et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0192226 A1 | 8/2011 | Hayner et al. |
| 2011/0201197 A1 | 8/2011 | Nilsson et al. |
| 2011/0234312 A1 | 9/2011 | Lachhwani et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0048017 A1* | 3/2012 | Kempe ............ G01C 19/5747 73/504.12 |
| 2012/0126349 A1 | 5/2012 | Horning et al. |
| 2012/0162947 A1 | 6/2012 | O'donnell et al. |
| 2012/0191398 A1 | 7/2012 | Murakami et al. |
| 2012/0326248 A1 | 12/2012 | Daneman et al. |
| 2013/0051586 A1 | 2/2013 | Stephanou et al. |
| 2013/0098153 A1 | 4/2013 | Trusov et al. |
| 2013/0099836 A1 | 4/2013 | Shaeffer et al. |
| 2013/0139591 A1 | 6/2013 | Acar |
| 2013/0139592 A1 | 6/2013 | Acar |
| 2013/0192364 A1 | 8/2013 | Acar |

(56) References Cited

U.S. PATENT DOCUMENTS

| | | |
|---|---|---|
| 2013/0192369 A1 | 8/2013 | Acar et al. |
| 2013/0199263 A1 | 8/2013 | Egretzberger et al. |
| 2013/0199294 A1 | 8/2013 | Townsend et al. |
| 2013/0221457 A1 | 8/2013 | Conti et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277772 A1 | 10/2013 | Bryzek et al. |
| 2013/0277773 A1 | 10/2013 | Bryzek et al. |
| 2013/0283911 A1 | 10/2013 | Ayazi et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |
| 2014/0190258 A1 | 7/2014 | Donadel et al. |
| 2014/0275857 A1 | 9/2014 | Toth et al. |
| 2014/0306773 A1 | 10/2014 | Kim |
| 2015/0059473 A1 | 3/2015 | Jia |
| 2015/0114112 A1 | 4/2015 | Valzasina et al. |
| 2015/0185012 A1 | 7/2015 | Acar |
| 2015/0268284 A1 | 9/2015 | Opris et al. |
| 2015/0321904 A1 | 11/2015 | Bryzek et al. |
| 2016/0003618 A1 | 1/2016 | Boser et al. |
| 2016/0332868 A1 | 11/2016 | Marx |

FOREIGN PATENT DOCUMENTS

| | | | |
|---|---|---|---|
| CN | 1206110 A | 1/1999 | |
| CN | 1221210 A | 6/1999 | |
| CN | 1272622 A | 11/2000 | |
| CN | 102156301 A | 8/2001 | |
| CN | 1389704 A | 1/2003 | |
| CN | 1532524 A | 9/2004 | |
| CN | 1595062 A | 3/2005 | |
| CN | 1595063 A | 3/2005 | |
| CN | 1603842 A | 4/2005 | |
| CN | 1617334 A | 5/2005 | |
| CN | 1659810 A | 8/2005 | |
| CN | 1693181 A | 11/2005 | |
| CN | 1780732 A | 5/2006 | |
| CN | 1813192 A | 8/2006 | |
| CN | 1816747 A | 8/2006 | |
| CN | 1818552 A | 8/2006 | |
| CN | 1886669 A | 12/2006 | |
| CN | 1905167 A | 1/2007 | |
| CN | 1948906 A | 4/2007 | |
| CN | 101038299 A | 9/2007 | |
| CN | 101044684 A | 9/2007 | |
| CN | 101059530 A | 10/2007 | |
| CN | 101067555 A | 11/2007 | |
| CN | 101069099 A | 11/2007 | |
| CN | 101078736 A | 11/2007 | |
| CN | 101171665 A | 4/2008 | |
| CN | 101180516 A | 5/2008 | |
| CN | 101198874 A | 6/2008 | |
| CN | 101213461 A | 7/2008 | |
| CN | 101217263 A | 7/2008 | |
| CN | 101239697 A | 8/2008 | |
| CN | 101257000 A | 9/2008 | |
| CN | 101270988 A | 9/2008 | |
| CN | 101316462 A | 12/2008 | |
| CN | 101329446 A | 12/2008 | |
| CN | 101426718 A | 5/2009 | |
| CN | 101459866 A | 6/2009 | |
| CN | 101519183 A | 9/2009 | |
| CN | 101520327 A | 9/2009 | |
| CN | 101561275 A | 10/2009 | |
| CN | 101634662 A | 1/2010 | |
| CN | 101638211 A | 2/2010 | |
| CN | 101639487 A | 2/2010 | |
| CN | 101666813 A | 3/2010 | |
| CN | 101738496 A | 6/2010 | |
| CN | 101813480 A | 8/2010 | |
| CN | 101839718 A | 9/2010 | |
| CN | 101055180 A | 10/2010 | |
| CN | 101855516 A | 10/2010 | |
| CN | 101858928 A | 10/2010 | |
| CN | 101916754 A | 12/2010 | |
| CN | 101922934 A | 12/2010 | |
| CN | 201688848 U | 12/2010 | |
| CN | 102109345 A | 6/2011 | |
| CN | 102332894 A | 1/2012 | |
| CN | 102337541 A | 2/2012 | |
| CN | 102364671 A | 2/2012 | |
| CN | 102597699 A | 7/2012 | |
| CN | 103209922 A | 7/2013 | |
| CN | 103210278 A | 7/2013 | |
| CN | 103221331 A | 7/2013 | |
| CN | 103221332 A | 7/2013 | |
| CN | 103221333 A | 7/2013 | |
| CN | 103221778 A | 7/2013 | |
| CN | 103221779 A | 7/2013 | |
| CN | 103221795 A | 7/2013 | |
| CN | 103238075 A | 8/2013 | |
| CN | 103363969 A | 10/2013 | |
| CN | 103363983 A | 10/2013 | |
| CN | 103364590 A | 10/2013 | |
| CN | 103364593 A | 10/2013 | |
| CN | 103368503 A | 10/2013 | |
| CN | 103368562 A | 10/2013 | |
| CN | 103368577 A | 10/2013 | |
| CN | 103376099 A | 10/2013 | |
| CN | 103376102 A | 10/2013 | |
| CN | 203261317 U | 10/2013 | |
| CN | 103403495 A | 11/2013 | |
| CN | 203275441 U | 11/2013 | |
| CN | 203275442 U | 11/2013 | |
| CN | 203301454 U | 11/2013 | |
| CN | 203349832 U | 12/2013 | |
| CN | 203349834 U | 12/2013 | |
| CN | 103663344 A | 3/2014 | |
| CN | 203683082 U | 7/2014 | |
| CN | 203719664 U | 7/2014 | |
| CN | 104094084 A | 10/2014 | |
| CN | 104105945 A | 10/2014 | |
| CN | 104220840 A | 12/2014 | |
| CN | 104272062 A | 1/2015 | |
| CN | 103221778 B | 3/2016 | |
| CN | 104272062 B | 5/2016 | |
| DE | 102009001244 A1 * | 9/2010 | ......... G01C 19/5747 |
| DE | 112011103124 T5 | 12/2013 | |
| DE | 102013014881 A1 | 3/2014 | |
| EP | 0638782 A1 | 2/1995 | |
| EP | 1055910 A1 | 11/2000 | |
| EP | 1335185 A1 | 8/2003 | |
| EP | 1460380 A1 | 9/2004 | |
| EP | 1521086 A1 | 4/2005 | |
| EP | 1688705 A2 | 8/2006 | |
| EP | 1832841 A1 | 9/2007 | |
| EP | 1832841 A1 | 9/2007 | |
| EP | 1860402 A1 | 11/2007 | |
| EP | 2053413 A1 | 4/2009 | |
| EP | 2096759 A1 | 9/2009 | |
| EP | 2259019 A1 | 12/2010 | |
| EP | 2466257 A1 | 6/2012 | |
| EP | 2616772 B1 | 6/2016 | |
| EP | 2647593 B1 | 8/2016 | |
| EP | 2619536 B1 | 11/2016 | |
| JP | 0989927 A | 4/1997 | |
| JP | 090899272 A | 4/1997 | |
| JP | 10239347 A | 9/1998 | |
| JP | 1164002 A | 3/1999 | |
| JP | 2000046560 A | 2/2000 | |

(56) References Cited

FOREIGN PATENT DOCUMENTS

| | | |
|---|---|---|
| JP | 2005024310 A | 1/2005 |
| JP | 2005114394 A | 4/2005 |
| JP | 2005294462 A | 10/2005 |
| JP | 3882972 B2 | 2/2007 |
| JP | 2007024864 A | 2/2007 |
| JP | 2008294455 A | 12/2008 |
| JP | 2009075097 A | 4/2009 |
| JP | 2009186213 A | 8/2009 |
| JP | 2009192458 A | 8/2009 |
| JP | 2009260348 A | 11/2009 |
| JP | 2010025898 A | 2/2010 |
| JP | 2010506182 A | 2/2010 |
| KR | 1020050056018 A | 6/2005 |
| KR | 1020070054469 A | 5/2007 |
| KR | 1020100041859 A | 4/2010 |
| KR | 2020110055449 A1 | 5/2011 |
| KR | 1020130060338 A | 6/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO9311415 A1 | 6/1993 |
| WO | WO-9503534 A1 | 2/1995 |
| WO | WO-0107875 A1 | 2/2001 |
| WO | WO-0175455 A2 | 10/2001 |
| WO | WO-2008014246 A1 | 1/2008 |
| WO | WO-2008059757 A1 | 5/2008 |
| WO | WO-2008087578 A2 | 7/2008 |
| WO | WO-2009038924 A2 | 3/2009 |
| WO | WO-2009050578 A2 | 4/2009 |
| WO | 2009156485 A1 | 12/2009 |
| WO | WO-2009156485 A1 | 12/2009 |
| WO | WO-2011016859 A2 | 2/2011 |
| WO | WO-2011016859 A3 | 2/2011 |
| WO | WO-2011107542 A2 | 9/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 13/857,363, Response filed Nov. 7, 2016 to Non Final Office Action dated Aug. 5, 2016", 12 pgs.

"U.S. Appl. No. 13/857,377, Non Final Office Action dated Oct. 13, 2016", 23 pgs.

"U.S. Appl. No. 13/860,780, Response Filed Nov. 18, 2016 to Final Office Action dated Aug. 18, 2016", 7 pgs.

"U.S. Appl. No. 14/658,579, Advisory Action dated Oct. 26, 2016", 3 pgs.

"U.S. Appl. No. 14/658,579, Notice of Allowance dated Nov. 2, 2016", 5 pgs.

"U.S. Appl. No. 14/658,579, Response filed Oct. 14, 2016 to Final Office Action dated Jul. 14, 2016", 9 pgs.

"U.S. Appl. No. 14/658,579, Response filed Oct. 20, 2016 to Final Office Action dated Jul. 14, 2016", 9 pgs.

"Chinese Application Serial No. 201310119730.9, Office Action dated Oct. 10, 2016", W/ English Translation, 8 pgs.

"Chinese Application Serial No. 201310120172.8, Response filed Oct. 17, 2016 to Office Action dated Aug. 1, 2016", with English translation of claims, 20 pgs.

"Chinese Application Serial No. 201380007523.2, Office Action dated Oct. 9, 2016", with English translation of claims, 7 pgs.

"Chinese Application Serial No. 201380007577.9, Office Action dated ", with English translation of claims, 7 pgs.

"Chinese Application Serial No. 201380007577.9, Response filed Nov. 2, 2016 to Office Action dated Aug. 18, 2016", 5 pgs.

"U.S. Appl. No. 13/821,589, Response filed Dec. 9, 2016 to Non Final Office Action dated Sep. 9, 2016", 8 pgs.

"U.S. Appl. No. 13/857,363, Notice of Allowance dated Dec. 2, 2016", 8 pgs.

"U.S. Appl. No. 13/857,377, Response filed Jan. 13, 2017 to Non Final Office Action dated Oct. 13, 2016", 11 pgs.

"U.S. Appl. No. 13/860,780. Notice of Allowance dated Dec. 12, 2016", 8 pgs.

"U.S. Appl. No. 15/218,852, Non Final Office Action dated Dec. 15, 2016", 16 pgs.

"Chinese Application Serial No. 201310119986.X, Office Action dated Dec. 27, 2016", with English Translation, 7 pgs.

"Chinese Application Serial No. 201310120172.8, Office Action dated Dec. 8, 2016", with English Translation, 11 pgs.

"Chinese Application Serial No, 201380007523.2, Response filed Dec. 20, 2016 to Office Action dated Oct. 9, 2016", with English translation of claims, 32 pgs.

"European Application Serial No. 13001694.2, Communication Pursuant to Article 94(3) EPC dated Nov. 2, 2016", 5 pgs.

"European Application Serial No. 13001694.2, Response filed Dec. 23, 2016 to Office Action dated Nov. 2, 2016", 8 pgs.

"European Application Serial No. 13001719.7, Response filed Nov. 9, 2016 to Communication Pursuant to Article 94(3) EPC dated Jul. 4, 2016", 14 pgs.

"European Application Serial No. 13001917.7, Response filed Nov. 8, 2016 to Office Action dated Apr. 11, 2016", 16 pgs.

"U.S. Appl. No. 12/849,742, Non Final Office Action dated Mar. 28, 2013", 9 pgs.

"U.S. Appl. No. 12/849,742, Non Final Office Action dated Aug. 23, 2012", 9 pgs.

"U.S. Appl. No. 12/849,742, Notice of Allowance dated Nov. 29, 2013", 7 pgs.

"U.S. Appl. No. 12/849,742, Response filed Jan. 23, 2013 to Non Final Office Action dated Aug. 23, 2012", 10 pgs.

"U.S. Appl. No. 12/849,742, Response filed Sep. 30, 2013 to Non-Final Office Action dated Mar. 28, 2013", 12 pgs.

"U.S. Appl. No. 12/849,742, Supplemental Notice of Allowability dated Mar. 17, 2014", 3 pgs.

"U.S. Appl. No. 12/849,742, Supplemental Notice of Allowability dated May 5, 2014", 2 pgs.

"U.S. Appl. No. 12/849,787, Non Final Office Action dated May 28, 2013", 18 pgs.

"U.S. Appl. No. 12/849,787, Notice of Allowance dated Dec. 11, 2013", 9 pgs.

"U.S. Appl. No. 12/849,787, Response filed Feb. 4, 2013 to Restriction Requirement dated Oct. 4, 2012", 7 pgs.

(56) References Cited

OTHER PUBLICATIONS

"U.S. Appl. No. 12/849,787, Response filed Oct. 28, 2013 to Non Final Office Action dated May 28, 2013", 12 pgs.

"U.S. Appl. No. 12/849,787, Restriction Requirement dated Oct. 4, 2012", 5 pgs.

"U.S. Appl. No. 12/849,787, Supplemental Notice of Allowability dated Mar. 21, 2014", 3 pgs.

"U.S. Appl. No. 12/947,543, Notice of Allowance dated Dec. 17, 2012", 11 pgs.

"U.S. Appl. No. 13/362,955, Final Office Action dated Nov. 19, 2014", 5 pgs.

"U.S. Appl. No. 13/362,955, Non Final Office Action dated Apr. 15, 2014", 9 pgs.

"U.S. Appl. No. 13/362,955, Notice of Allowance dated Feb. 25, 2015", 8 pgs.

"U.S. Appl. No. 13/362,955, Response filed Jan. 16, 2015 to Final Office Action dated Nov. 19, 2014", 9 pgs.

"U.S. Appl. No. 13/362,955, Response filed Feb. 17, 2014 to Restriction Requirement dated Dec. 17, 2013", 9 pgs.

"U.S. Appl. No. 13/362,955, Response filed Aug. 15, 2014 to Non Final Office Action dated May 15, 2014", 13 pgs.

"U.S. Appl. No. 13/362,955, Restriction Requirement dated Dec. 17, 2013", 6 pgs.

"U.S. Appl. No. 13/363,537, Corrected Notice of Allowance dated Jan. 28, 2015", 2 pgs.

"U.S. Appl. No. 13/363,537, Examiner Interview Summary dated Sep. 29, 2014", 3 pgs.

"U.S. Appl. No. 13/363,537, Final Office Action dated Jun. 27, 2014", 8 pgs.

"U.S. Appl. No. 13/363,537, Non Final Office Action dated Feb. 6, 2014", 10 pgs.

"U.S. Appl. No. 13/363,537, Notice of Allowance dated Nov. 7, 2014", 5 pgs.

"U.S. Appl. No. 13/363,537, Response filed Jun. 6, 2014 to Non Final Office Action dated Feb. 6, 2014", 11 pgs.

"U.S. Appl. No. 13/363,537, Response filed Sep. 29, 2014 to Final Office Action dated Jun. 27, 2014", 9 pgs.

"U.S. Appl. No. 13/742,942, Notice of Allowance dated Jan. 28, 2014", 9 pgs.

"U.S. Appl. No. 13/742,942, Supplemental Notice of Allowability dated Apr. 10, 2014", 2 pgs.

"U.S. Appl. No. 13/742,994, Final Office Action dated Nov. 24, 2015", 11 pgs.

"U.S. Appl. No. 13/742,994, Non Final Office Action dated May 1, 2015", 20 pgs.

"U.S. Appl. No. 13/742.994, Response filed Jan. 8, 2016 to Final Office Action dated Nov. 24, 2015", 8 pgs.

"U.S. Appl. No. 13/742,994, Response filed Jul. 31, 2015 to Non Final Office Action dated May 1, 2015", 12 pgs.

"U.S. Appl. No. 13/746,016, Notice of Allowance dated Jan. 17, 2014", 10 pgs.

"U.S. Appl. No. 13/755,841, Notice of Allowance dated May 7, 2014", 8 pgs.

"U.S. Appl. No. 13/755,841, Preliminary Amendment filed Oct. 10, 2013", 10 pgs.

"U.S. Appl. No. 13/755,841, Response filed Apr. 21, 2014 to Restriction Requirement dated Feb. 21, 2014", 7 pgs.

"U.S. Appl. No. 13/755,841, Restriction Requirement dated Feb. 21, 2014", 6 pgs.

"U.S. Appl. No. 13/755,841, Supplemental Notice of Allowability dated Jun. 27, 2014", 2 pgs.

"U.S. Appl. No. 13/755,953, Non Final Office Action dated May 14, 2015", 11 pgs.

"U.S. Appl. No. 13/755,953, Notice of Allowance dated Oct. 28, 2015", 5 pgs.

"U.S. Appl. No. 13/755,953, Response filed May 4, 2015 to Restrictiion Requirement dated Mar. 3, 2015", 7 pgs.

"U.S. Appl. No. 13/755,953, Response filed Sep. 15, 2015 to Non Final Office Action dated May 14, 2015", 10 pgs.

"U.S. Appl. No. 13/755,953, Restriction Requirement dated Mar. 3, 2015", 6 pgs.

"U.S. Appl. No. 13/765,068, Notice of Allowance dated May 7, 2015", 12 pgs.

"U.S. Appl. No. 13/813,443, Non Final Office Action dated Jun. 10, 2015", 10 pgs.

"U.S. Appl. No. 13/813,443, Notice of Allowance dated Feb. 4, 2016", 7 pgs.

"U.S. Appl. No. 13/813,443, Preliminary Amendment dated Jan. 31, 2013", 3 pgs.

"U.S. Appl. No. 13/813,443, Response filed May 22, 2015 to Restriction Requirement dated Apr. 29, 2015", 7 pgs.

"U.S. Appl. No. 13/813,443, Response filed Oct. 13, 2015 to Non Final Office Action dated Jun. 10, 2015", 7 pgs.

"U.S. Appl. No. 13/813,443, Restriction Requirement dated Apr. 29, 2015", 6 pgs.

"U.S. Appl. No. 13/821,586, Non Final Office Action dated Jan. 15, 2015", 8 pgs.

"U.S. Appl. No. 13/821,586, Notice of Allowance dated Jun. 5, 2015", 6 pgs.

"U.S. Appl. No. 13/821,586, Preliminary Amendment dated Mar. 8, 2013", 6 pgs.

"U.S. Appl. No. 13/821,586, Response filed May 15, 2015 to Non Final Office Action dated Jan. 15, 2015", 12 pgs.

"U.S. Appl. No. 13/821,586, Response filed Nov. 24, 2014 to Restriction Requirement dated Sep. 22, 2014", 6 pgs.

"U.S. Appl. No. 13/821,586, Restriction Requirement dated Sep. 22, 2014", 4 pgs.

"U.S. Appl. No. 13/821,589, Final Office Action dated Mar. 12, 2015", 13 pgs.

"U.S. Appl. No. 13/821,589, Final Office Action dated Jul. 17, 2015", 14 pgs.

"U.S. Appl. No. 13/821,589, Non Final Office Action dated Feb. 8, 2016", 9 pgs.

"U.S. Appl. No. 13/821,589, Non Final Office Action dated Jul. 9, 2014", 10 pgs.

"U.S. Appl. No. 13/821,589, Preliminary Amendment dated Mar. 8, 2013", 6 pgs.

"U.S. Appl. No. 13/821,589, Response filed May 9, 2016 to Non Final Office Action dated Feb. 8, 2016", 7 pgs.

"U.S. Appl. No. 13/821,589, Response filed May 12, 2015 toFinal Office Action dated Mar. 12, 2015", 12 pgs.

"U.S. Appl. No. 13/821,589, Response filed Jun. 11, 2014 to Restriction Requirement dated Apr. 11, 2014", 6 pgs.

"U.S. Appl. No. 13/821,589, Response filed Oct. 19, 2015 to Final Office Action dated Jul. 17, 2015", 10 pgs.

"U.S. Appl. No. 13/821,589, Response filed Nov. 10, 2014 to Non Final Office Action dated Jul. 9, 2014", 15 pgs.

"U.S. Appl. No. 13/821,589, Restriction Requirement dated Apr. 11, 2014", 10 pgs.

"U.S. Appl. No. 13/821,598, Final Office Action dated Jan. 21, 2016", 9 pgs.

"U.S. Appl. No. 13/821,598, Non Final Office Action dated Jul. 7, 2015", 9 pgs.

"U.S. Appl. No. 13/821,598, Non Final Office Action dated Nov. 20, 2014", 9 pgs.

"U.S. Appl. No. 13/821,598, Preliminary Amendment dated Mar. 8, 2013", 7 pgs.

"U.S. Appl. No. 13/821,598, Response filed Feb. 20, 2015 to Non Final Office Action dated Nov. 20, 2014", 12 pgs.

"U.S. Appl. No. 13/821,598, Response filed Oct. 7, 2015 to Non Final Office Action dated Jul. 7, 2015", 10 pgs.

"U.S. Appl. No. 13/821,598, Response filed Oct. 15, 2014 to Restriction Requirement dated Aug. 15, 2014", 8 pgs.

"U.S. Appl. No. 13/821,598, Restriction Requirement dated Aug. 15, 2014", 11 pgs.

"U.S. Appl. No. 13/821,609, Notice of Allowance dated Mar. 23, 2015", 11 pgs.

"U.S. Appl. No. 13/821,609, Preliminary Amendment dated Mar. 8, 2013", 3 pgs.

"U.S. Appl. No. 13/821,609, Response filed Feb. 13, 2015 to Restriction Requirement dated Dec. 15, 2014", 6 pgs.

(56) References Cited

OTHER PUBLICATIONS

"U.S. Appl. No. 13/821,609, Restriction Requirement dated Dec. 15, 2014", 7 pgs.
"U.S. Appl. No. 13/821,612, Non Final Office Action dated Jul. 23, 2014", 8 pgs.
"U.S. Appl. No. 13/821,612, Notice of Allowance dated Dec. 10, 2014", 8 pgs.
"U.S. Appl. No. 13/821,612, Preliminary Amendment dated Mar. 8, 2013", 3 pgs.
"U.S. Appl. No. 13/821,612, Response filed Oct. 23, 2014 to Non Final Office Action dated Jul. 23, 2014", 6 pgs.
"U.S. Appl. No. 13/821,619, Ex Parte Quayle Action dated Jul. 16, 2015", 8 pgs.
"U.S. Appl. No. 13/821,619, Non Final Office Action dated Oct. 13, 2015", 11 pgs.
"U.S. Appl. No. 13/821,619, Preliminary Amendment dated Mar. 8, 2013", 3 pgs.
"U.S. Appl. No. 13/821,619, Response filed Sep. 16, 2015 to Ex Parte Quayle Action dated Jul. 16, 2015", 11 pgs.
"U.S. Appl. No. 13/821,793, Non Final Office Action dated Jul. 27, 2015", 14 pgs.
"U.S. Appl. No. 13/821,793, Notice of Allowance dated Nov. 24, 2015", 5 pgs.
"U.S. Appl. No. 13/821,793, Preliminary Amendment dated Mar. 8, 2013", 3 pgs.
"U.S. Appl. No. 13/821,793, Response filed Oct. 27, 2015 to Non Final Office Action dated Jul. 27, 2015", 12 pgs.
"U.S. Appl. No. 13/821,842, Corrected Notice of Allowance dated Oct. 19, 2015", 2 pgs.
"U.S. Appl. No. 13/821,842, Examiner Interview Summary dated Sep. 15, 2015", 3 pgs.
"U.S. Appl. No. 13/821,842, Non Final Office Action dated Mar. 18, 2015", 20 pgs.
"U.S. Appl. No. 13/821,842, Notice of Allowance Received dated Sep. 15, 2015", 13 pgs.
"U.S. Appl. No. 13/821,842, Preliminary Amendment dated Mar. 8, 2013", 3 pgs.
"U.S. Appl. No. 13/821,842, Response filed Jun. 18, 2015 Non Final Office Action dated Mar. 18, 2015", 11 pgs.
"U.S. Appl. No. 13/821,842, Supplemental Notice of Allowability dated Sep. 28, 2015", 2 pgs.
"U.S. Appl. No. 13/821,853, Final Office Action dated Jan. 25, 2016", 6 pgs.
"U.S. Appl. No. 13/821,853, Final Office Action dated Jun. 18, 2015", 7 pgs.
"U.S. Appl. No. 13/821,853, Non Final Office Action dated Feb. 18, 2015", 15 pgs.
"U.S. Appl. No. 13/821,853, Non Final Office Action dated Jul. 30, 2014", 10 pgs.
"U.S. Appl. No. 13/821,853, Notice of Allowance dated May 20, 2016", 8 pgs.
"U.S. Appl. No. 13/821,853, Preliminary Amendment dated Mar. 8, 2013", 3 pgs.
"U.S. Appl. No. 13/821,853, Response filed Apr. 25, 2016 to Final Office Action dated Jan. 25, 2016", 7 pgs.
"U.S. Appl. No. 13/821,853, Response filed May 18, 2015 to Non Final Office Action dated Feb. 18, 2015", 12 pgs.
"U.S. Appl. No. 13/821,853, Response filed Dec. 1, 2014 to Non Final Office Action dated Jul. 30, 2014", 10 pgs.
"U.S. Appl. No. 13/857,349, Non Final Office Action dated Oct. 8, 2015", 10 pgs.
"U.S. Appl. No. 13/857,349, Notice of Allowance dated May 6, 2016", 9 pgs.
"U.S. Appl. No. 13/857,349, Response filed Jan. 8, 2016 to Non Final Office Action dated Oct. 8, 2015", 10 pgs.
"U.S. Appl. No. 13/857,377, Non Final Office Action dated Apr. 27, 2016".
"U.S. Appl. No. 13/860,761, Advisory Action dated Mar. 25, 2015", 3 pgs.
"U.S. Appl. No. 13/860,761, Final Office Action dated Jan. 15, 2015", 14 pgs.
"U.S. Appl. No. 13/860,761, Non Final Office Action dated Aug. 19, 2014", 13 pgs.
"U.S. Appl. No. 13/860,761, Notice of Allowance dated Apr. 28, 2015", 8 pgs.
"U.S. Appl. No. 13/860,761, Response filed Mar. 16, 2015 to Final Office Action dated Jan. 16, 2015", 12 pgs.
"U.S. Appl. No. 13/860,761, Response filed Apr. 16, 2015 to Advisory Action dated Mar. 25, 2015", 11 pgs.
"U.S. Appl. No. 13/860,761, Response filed Dec. 19, 2014 to Non Final Office Action dated Aug. 19, 2014", 12 pgs.
"U.S. Appl. No. 13/860,780, Non Final Office Action dated Apr. 14, 2016", 25 pgs.
"U.S. Appl. No. 14/023,869, Response filed Apr. 15, 2016 to Final Office Action dated Dec. 15, 2015", 12 pgs.
"U.S. Appl. No. 14/023,869, Examiner Interview Summary dated Apr. 19, 2016", 3 pgs.
"U.S. Appl. No. 14/023,869, Final Office Action dated Dec. 15, 2015", 14 pgs.
"U.S. Appl. No. 14/023,869, Non Final Office Action dated Jun. 15, 2015", 15 pgs.
"U.S. Appl. No. 14/023,869, Notice of Allowance dated May 4, 2016", 8 pgs.
"U.S. Appl. No. 14/023,869, Preliminary Amendment filed Dec. 4, 2013", 3 pgs.
"U.S. Appl. No. 14/023,869, Response filed Nov. 16, 2015 to Non Final Office Action dated Jun. 15, 2015", 12 pgs.
"U.S. Appl. No. 14/658,579, Final Office Action dated Oct. 21, 2015", 10 pgs.
"U.S. Appl. No. 14/658,579, Non Final Office Action dated Mar. 16, 2016", 5 pgs.
"U.S. Appl. No. 14/658,579, Non Final Office Action dated Jul. 1, 2015", 9 pgs.
"U.S. Appl. No. 14/658,579, Prliminary Amendment filed Mar. 18, 2015", 8 pgs.
"U.S. Appl. No. 14/658,579, Response filed Feb. 22, 2016 to Final Office Action dated Oct. 21, 2015", 11 pgs.
"U.S. Appl. No. 14/658,579, Response filed Jun. 16, 2016 to Non-Final Office Action dated Mar. 16, 2016", 9 pgs.
"U.S. Appl. No. 14/658,579, Response filed Oct. 1, 2015 to Non Final Office Action dated Jul. 1, 2015", 11 pgs.
"Application Serial No. PCT/US2011/051994, International Republished Application dated Jun. 7, 2012", 1 pg.
"Application Serial No. PCT/US2011/052006, International Republished Application dated Jun. 7, 2012", 1 pg.
"Application Serial No. PCT/US2011/052417, International Republished Application dated Jun. 7, 2012", 1 pg.
"Chinese Application Serial No. 2010800423190, Office Action dated Mar. 26, 2014", 10 pgs.
"Chinese Application Serial No. 2010800423190, Office Action dated Dec. 3, 2014", 3 pgs.
"Chinese Application Serial No. 2010800423190, Response filed Feb. 15, 2015 to Office Action dated Dec. 3, 2014", 3 pgs.
"Chinese Application Serial No. 2010800423190, Response filed Aug. 11, 2014 to Office Action dated Mar. 26, 2014", w/English Claims, 11 pgs.
"Chinese Application Serial No. 201180044919.5, Office Action dated Apr. 25, 2016", 7 pgs.
"Chinese Application Serial No. 201180044919.5, Office Action dated Jun. 25, 2015", w/ English Translation, 8 pgs.
"Chinese Application Serial No. 201180044919.5, Response filed Jan. 11, 2016 to Office Action dated Jun. 25, 2015", not in English, 7 pgs.
"Chinese Application Serial No. 201180044919.5, Response filed May 12, 2016 to Office Action dated Apr. 25, 2016", 13 pgs.
"Chinese Application Serial No. 201180053926.1, Amendment filed Aug. 21, 2013", w/English Translation, 13 pgs.
"Chinese Application Serial No. 201180053926.1, Office Action dated Jan. 13, 2014", 7 pgs.
"Chinese Application Serial No. 201180053926.1, Response filed Apr. 29, 2014 to Office Action dated Jan. 13, 2014", w/English Claims, 10 pgs.

(56) References Cited

OTHER PUBLICATIONS

"Chinese Application Serial No. 201180054796.3, Office Action dated Jan. 16, 2014", with English translation of claims, 8 pgs.
"Chinese Application Serial No. 201180054796.3, Office Action dated Jan. 30, 2015", with English translation of claims, 5 pgs.
"Chinese Application Serial No. 201180054796.3, Office Action dated Jun. 4, 2015", w/ English Translation, 7 pgs.
"Chinese Application Serial No. 201180054796.3, Office Action dated Sep. 4, 2014", w/English Claims, 11 pgs.
"Chinese Application Serial No. 201180054796.3, Response filed Jun. 30, 2014 to Office Action dated Jan. 16, 2014", w/English Claims, 3 pgs.
"Chinese Application Serial No. 201180054796.3, Response filed Nov. 19, 2014 to Office Action dated Sep. 4, 2014", with English translation of claims, 7 pgs.
"Chinese Application Serial No. 201180054796.3, Response filed Apr. 14, 2015 to Office Action dated Jan. 30, 2015", w/ English Claims, 30 pgs.
"Chinese Application Serial No. 201180055029.4, Office Action dated Jan. 13, 2014", 7 pgs.
"Chinese Application Serial No. 201180055229.4, Office Action dated Jul. 2, 2014", w/English Translation, 5 pgs.
"Chinese Application Serial No. 201180055029.4, Response filed May 27, 2014 to Office Action dated Jan. 13, 2014", w/English Claims; 29 pgs.
"Chinese Application Serial No. 201180055029.4, Response filed Nov. 14, 2014 to Office Action dated Jul. 2, 2014", w/English Claims, 23 pgs.
"Chinese Application Serial No. 201180055309.5, Office Action dated Jan. 8, 2015", with English translation of claims, 5 pgs.
"Chinese Application Serial No. 201180055309.5, Office Action dated Mar. 31, 2014", w/English Claims, 7 pgs.
"Chinese Application Serial No. 201180055309.5, Response filed Jan. 14, 2015 to Office Action dated Jan. 8, 2015", 8 pgs.
"Chinese Application Serial No. 201180055309.5, Response filed Aug. 13, 2014 to Office Action dated Mar. 31, 2014", w/English Claims, 25 pgs.
"Chinese Application Serial No. 201180055309.5, Voluntary Amendment filed Aug. 23, 2013", w/English Translation, 13 pgs.
"Chinese Application Serial No. 201180055630.3, Office Action dated May 16, 2016", (English Translation), 9 pgs.
"Chinese Application Serial No. 201180055630.3, Office Action dated Jul. 10, 2015", w/ English Claims, 8 pgs.
"Chinese Application Serial No. 201180055630.3, Office Action dated Dec. 7, 2015", W/ English Translation, 5 pgs.
"Chinese Application Serial No. 201180055630.3, Office Action dated Dec. 22, 2014", with English translation of claims, 10 pgs.
"Chinese Application Serial No. 201180055630,3, Response filed Feb. 19, 2016 to Office Action dated Dec. 7, 2015", W/ English Translation of Claim, 10 pgs.
"Chinese Application Serial No. 201180055630.3, Response filed Sep. 25, 2015 to Office Action dated Jul 10, 2015", awl English Claims, 14 pgs.
"Chinese Application Serial No. 201180055630.3, Response filed Apr. 20, 2015 to Office Action dated Dec. 22, 2014", w/ English Claims, 10 pgs.
"Chinese Application Serial No. 201180055792.7, Office Action dated Jul. 21, 2015", w/ English Translation, 5 pgs.
"Chinese Application Serial No. 201180055792.7, Office Action dated Dec. 22, 2014", with English translation of claims, 10 pgs.
"Chinese Application Serial No. 201180055792.7, Response filed May 5, 2015 to Office Action dated Dec. 22, 2014", w/ English Claims, 15 pgs.
"Chinese Application Serial No. 201180055794.6, Office Action dated Dec. 17, 2014", with English translation of claims, 9 pgs.
"Chinese Application Serial No. 201180055794.6, Response filed May 4, 2015 to Office Action dated Dec. 17, 2014", w/ English Claims, 15 pgs.
"Chinese Application Serial No. 201180055823.9, Office Action dated Mar. 19, 2015", w/ English Claims, 8 pgs.

"Chinese Application Serial No. 201180055823,9, Office Action dated Nov. 17, 2015", w/ English Translation, 8 pgs.
"Chinese Application Serial No. 201180055823.9, Response filed Feb. 2, 2016 to Office Action dated Nov. 17, 2015", (English Translation of Claims), 15 pgs.
"Chinese Application Serial No. 201180055823.9,Response filed Aug. 3, 2015 to Office Action dated Mar. 19, 2015", w/ English Translation, 14 pgs.
"Chinese Application Serial No. 201180055845.5, Office Action dated Mar. 4, 2015", w/ English Claims, 8 pgs.
"Chinese Application Serial No. 201180055845.5, Office Action dated Aug. 5, 2015", w/ English Translation, 5 pgs.
"Chinese Application Serial No. 201180055845.5, Response filed Nov. 20, 2015 to Office Action dated Aug. 5, 2015", With English Claims, 9 pgs.
"Chinese Application Serial No. 201180055845.5,Response filed Jul. 13, 2015 to Office Action dated Mar. 4, 2015", w/ English Translation, 17 pgs.
"Chinese Application Serial No. 201310115550.3, Office Action dated May 22, 2015", w/ English Claims, 8 pgs.
"Chinese Application Serial No. 201310115550,3, Response filed Sep. 30, 2015 to Office Action dated May 22, 2015", w/ English Claims, 15 pgs.
"Chinese Application Serial No. 201310118845.6, Office Action dated Sep. 9, 2014", with English translation of claims, 8 pgs.
"Chinese Application Serial No. 2013101188456, Response filed Jan. 21, 2015", with English translation of claims, 16 pgs.
"Chinese Application Serial No. 201310119472.4, Office Action dated Sep. 9, 2014", w/English Translation, 11 pgs.
"Chinese Application Serial No. 201310119472.4, Response filed Jan. 21, 2015", with English translation of claims, 16 pgs.
"Chinese Application Serial No. 201310119730.9, Office Action dated Jan. 29, 2016", w/ English Translation, 7 pgs.
"Chinese Application Serial No. 201310119730.9, Office Action dated May 4, 2015", w/ English Claims, 8 pgs.
"Chinese Application Serial No. 201310119730.9, Response filed Jun. 13, 2016 to Office Action dated Jan. 29, 2016", 19 pgs.
"Chinese Application Serial No. 201310119730.9, Response filed Sep. 18, 2015 to Office Action dated May 4, 2015", not in English, 5 pgs.
"Chinese Application Serial No. 201310119806.8, Office Action dated May 13, 2016", 8 pgs.
"Chinese Application Serial No. 201310119806.8, Office Action dated Jul. 3, 2015", w/ English Claims, 12 pgs.
"Chinese Application Serial No. 201310119806,8, Response filed Jan. 18, 2016 to Office Action dated Jul. 3, 2015", (English Translation of Claims), 11 pgs.
"Chinese Application Serial No. 201310119986.X, Office Action dated May 12, 2015", English Claims, 14 pgs.
"Chinese Application Serial No. 201310119986.X, Office Action dated Dec. 18, 2015", w/ English Translation, 6 pgs.
"Chinese Application Serial No. 201310119986.X, Response filed Apr. 29, 2016 to Office Action dated Dec. 18, 2015", (English Translation of Claims), 14 pgs.
"Chinese Application Serial No. 201310119986.X, Response filed Sep. 25, 2015 to Office Action dated May 12, 2015", w/ English Claims, 7 pgs.
"Chinese Application Serial No. 201310120172.8, Office Action dated Nov. 3, 2015", w/ English Translation, 11 pgs.
"Chinese Application Serial No. 201310120172.8, Response filed May 18, 2016 to Office Action dated Nov. 3, 2015", with English translation of claims, 21 pgs.
"Chinese Application Serial No. 201310127961.4, Office Action dated May 6, 2015", w/ English Claims, 7 pgs.
"Chinese Application Serial No. 201310127961.4, Response filed Sep. 2, 2015 to Office Action dated May 6, 2015", w/ English Claims, 19 pgs.
"Chinese Application Serial No. 201310128046,7, Office Action dated Jul. 23, 2015", w/ English Translation, 7 pgs.
"Chinese Application Serial No. 201310128046.7, Response filed Oct. 14, 2015 to Office Action dated Jul. 23, 2015", w/ English Claims, 23 pgs.

(56) References Cited

OTHER PUBLICATIONS

"Chinese Application Serial No. 201310415336.X, Office Action dated Apr. 26, 2016", w/ English Translation, 11 pgs.
"Chinese Application Serial No. 201310415336.X, Office Action dated Jul. 3, 2015", w/ English Claims, 9 pgs.
"Chinese Application Serial No. 201310415336.X, Response filed Jan. 18, 2016 to Office Action dated Jul. 3, 2015", (English Translation of Claims), 11 pgs.
"Chinese Application Serial No. 201320165465.3, Office Action dated Jul. 22, 2013", w/English Translation, 2 pgs.
"Chinese Application Serial No. 201320165465.3, Response filed Aug, 7, 2013 to Office Action dated Jul. 22, 2013", w/English Translation, 39 pgs.
"Chinese Application Serial No. 201320171504.0, Office Action dated Jul. 22, 2013", w/English Translation, 3 pgs.
"Chinese Application Serial No. 201320171504.0, Response filed Jul. 25, 2013 to Office Action dated Jul. 22, 2013", w/English Translation, 33 pgs.
"Chinese Application Serial No. 201320171616.6, Office Action dated Jul. 10, 2013", w/English Translation, 2 pgs.
"Chinese Application Serial No. 201320171757.8, Office Action dated Jul. 11, 2013", w/English Translation, 2 pgs.
"Chinese Application Serial No. 201320171757.8, Response filed Jul. 25, 2013 to Office Action dated Jul. 11, 2013", w/English Translation, 21 pgs.
"Chinese Application Serial No. 201320171757.8, Response filed Jul. 26, 2013 to Office Action dated Jul. 10, 2013", w/English Translation, 40 pgs.
"Chinese Application Serial No. 201320172128.7, Office Action dated Jul. 12, 2013", w/English Translation, 3 pgs.
"Chinese Application Serial No. 201320172128.7, Response filed Aug. 7, 2013 to Office Action dated Jul. 12, 2013", w/English Translation, 39 pgs.
"Chinese Application Serial No. 201320172366.8, Office Action dated Jan. 30, 2014", w/English Claims, 3 pgs.
"Chinese Application Serial No. 201320172366.8, Office Action dated Jul. 9, 2013", \w/English Translation, 3 pgs.
"Chinese Application Serial No. 201320172366.8, Office Action dated Oct. 25, 2013", w/English Translation, 8 pgs.
"Chinese Application Serial No. 201320172366.8, Response filed Mar. 18, 2014 to Office Action dated Jan. 20, 2014", w/English Claims, 20 pgs.
"Chinese Application Serial No. 201320172366.8, Response filed Sep. 16, 2013 to Office Action dated Jul. 9, 2013", w/English Translation, 24 pgs.
"Chinese Application Serial No. 201320172366.8, Response filed Dec. 24, 2013 to Office Action dated Oct. 25, 2013", w/English Claims, 11 pgs.
"Chinese Application Serial No. 201320172367.2, Office Action dated Jul. 9, 2013", w/English Translation, 2 pgs.
"Chinese Application Serial No. 201320172367.2, Response filed Sep. 16, 2013 to Office Action dated Jul. 9, 2013", w/English Translation, 24 pgs.
"Chinese Application Serial No. 201320185461.1, Office Action dated Jul. 23, 2013", w/English Translation, 3 pgs.
"Chinese Application Serial No. 201320185461.1, Response filed Sep. 10, 2013 to Office Action dated Jul. 23, 2013", w/English Translation, 25 pgs.
"Chinese Application Serial No. 201320186292.3, Office Action dated Jul. 19, 2013", w/English Translation, 2 pgs.
"Chinese Application Serial No. 201320186292.3, Response filed Sep. 10, 2013 to Office Action dated Jul. 19, 2013", w/English Translation, 23 pgs.
"Chinese Application Serial No. 201320565239.4, Office Action dated Jan. 16, 2014", w/English Translation, 3 pgs.
"Chinese Application Serial No. 201320565239.4, Response filed Mar. 31, 2014 to Office Action dated Jan. 16, 2014", w/English Claims, 38 pgs.
"Chinese Application Serial No. 201380007523.2, Office Action dated Dec. 31, 2015"°, w/ English Translation, 12 pgs.
"Chinese Application Serial No. 201380007523.2, Response filed May 31, 2016 to Office Action dated Dec. 31, 2015", with English translation of claims, 16 pgs.
"Chinese Application Serial No. 201380007577.9, Office Action dated Dec. 21, 2015", w/ English Translation, 9 pgs.
"Chinese Application Serial No. 201380007577,9, Response filed May 5, 2016 to Office Action dated Dec. 21, 2015", w/ English Claims, 17 pgs.
"Chinese Application Serial No. 201380007588.7, Notification to Make Rectification dated Aug. 18, 2014", w/English Translation, 2 pgs.
"Chinese Application Serial No. 201380007588.7, Office Action dated Jun. 10, 2015", w/ English Claims, 7 pgs.
"Chinese Application Serial No. 201380007588.7, Response filed Oct. 24, 2014", with English translation, 3 pgs.
"Chinese Application Serial No. 201380007588.7, Response filed Oct. 26, 2015 to Office Action dated Jun. 1, 2015", w/ English Claims, 9 pgs.
"Chinese Application Serial No. 201380007615.0, Notification to Make Rectification dated Aug. 18, 2014", w/English Translation, 2 pgs.
"Chinese Application Serial No. 201380007615.0, Office Action dated May 6, 2015", w/ English Claims, 7 pgs.
"Chinese Application Serial No. 201380007615.0, Response filed Jan. 5, 2016 to Office Action dated May 6, 2015", w/ English Claims, 13 pgs.
"Chinese Application Serial No. 201380007615.0, Response filed Oct. 24, 2014", with English translation, 3 pgs.
"Chinese Application Serial No. 201380007615.0, Response filed Nov. 23, 2015 to Office Action dated May 6, 2015", With English Claims, 15 pgs.
"DigiSiMic™ Digital Silicon Microphone Pulse Part Number: TC100E", TC100E Datasheet version 4.2 DigiSiMic™ Digital Silicon Microphone. (Jan. 2009), 6 pgs.
"EPCOS MEMS Microphone with TSV", (2005), 1 pg.
"European Application Serial No. 10806751.3, Extended European Search Report dated Jan. 7, 2014", 7 pgs.
"European Application Serial No. 10806751.3, Response filed Jul. 24, 2014 to Office Action dated Jan. 24, 2014", 26 pgs.
"European Application Serial No. 118260070.2, Office Action dated Mar. 12, 2014", 1 pg.
"European Application Serial No. 11826043.9, Extended European Search Report dated Feb. 23, 2016", 6 pgs.
"European Application Serial No. 11826043.9, Office Action dated May 6, 2013", 2 pgs.
"European Application Serial No. 11826043.9, Response filed Nov. 4, 2013 to Office Action dated May 6, 2013", 6 pgs.
"European Application Serial No. 11826067.8, Extended European Search Report dated Oct. 6, 2014", 10 pgs.
"European Application Serial No. 11826067.8, Response filed Apr. 27, 2015 to Extended European Search Report dated Oct. 6, 2014", 32 pgs.
"European Application Serial No. 11826068.6, Extended European Search Report dated Jul. 16, 2014", 10 pgs.
"European Application Serial No. 11826068.6, Response filed Feb. 9, 2015", 30 pgs.
"European Application Serial No. 11826069.4, Extended European Search Report dated Jul. 23, 2015", 8 pgs.
"European Application Serial No. 11826069.4, Response filed Feb. 22, 2016 to Extended European Search Report dated Jul. 23, 2015", W/ English Translation, 26 pgs.
"European Application Serial No. 11826070.2, Extended European Search Report dated Feb. 21, 2014", 5 pgs.
"European Application Serial No. 11826070.2, Response filed Sep. 19, 2014 to Office Action dated Mar. 12, 2014", 11 pgs.
"European Application Serial No. 11826071.0, Examination Notification Art. 94(3) dated Dec. 11, 2014", 4 pgs.
"European Application Serial No. 11826071.0, Extended European Search Report dated Feb. 20, 2014", 6 pgs.
"European Application Serial No. 11826071.0, Office Action dated Mar. 12, 2014", 1 pg.
"European Application Serial No. 11826071.0, Response filed Sep. 19, 2014 to Office Action dated Mar. 12, 2014", 20 pgs.

(56) References Cited

OTHER PUBLICATIONS

"European Application Serial No. 11826071.0, Response filed Apr. 13, 2015 to Examination Notification Art. 94(3) dated Dec. 11, 2014", 5 pgs.
"European Application Serial No. 11827347.3, Extended European Search Report dated Jul. 31, 2015", 6 pgs.
"European Application Serial No. 11827347.3, Office Action dated May 2, 2013", 6 pgs.
"European Application Serial No. 11827347.3, Response filed Oct. 30, 2013 to Office Action dated May 2, 2013", 9 pgs.
"European Application Serial No. 11827357.2, Extended European Search Report dated Aug. 26, 2015", 4 pgs.
"European Application Serial No. 11827384.6, Extended European Search Report dated Nov. 12, 2014", 6 pgs 4.
"European Application Serial No. 13001692.6, Extended European Search Report dated Jul. 24, 2013", 5 pgs.
"European Application Serial No. 13001692.6, Response filed Apr. 1, 2014 to European Search Report dated Jul. 24, 2013", 19 pgs.
"European Application Serial No. 13001692.6, Response filed Apr. 1, 2014 to Extended European Search Report dated Jul. 24, 2013", 19 pgs.
"European Application Serial No. 13001694.2, Extended European Search Report dated Oct. 2, 2015", 8 pgs.
"European Application Serial No. 13001695.9, European Search Report dated Oct. 5, 2014", 6 pgs.
"European Application Serial No. 13001695.9, Extended European Search Report dated Jan. 22, 2015", 8 pgs.
"European Application Serial No. 13001695.9, Response filed Aug. 24, 2015 to Extended European Search Report dated Jan. 22, 2015", 9 pgs.
"European Application Serial No. 13001696.7, Extended European Search Report dated Aug. 6, 2013", 4 pgs.
"European Application Serial No. 13001719.7, Extended European Search Report dated Jun. 24, 2014", 10 pgs.
"European Application Serial No. 13001719.7, Response filed Jan. 21, 2015", 29 pgs.
"European Application Serial No. 13001720.5, Extended European Search Report dated Aug. 20, 2015", 7 pgs.
"European Application Serial No. 13001721.3, Extended European Search Report dated Jul. 18, 2013", 9 pgs.
"European Application Serial No. 13001721.3, Response filed Apr. 7, 2014 to Extended European Search Report dated Jul. 18, 2013", 25 pgs.
"European Application Serial No. 13001917.7, Extended European Search Report dated Apr. 11, 2016", 5 pgs.
"European Application Serial No. 13001918.5, Extended European Search Report dated Dec. 3, 2015", 8 pgs.
"International Application Serial No. PCT/US2010/002166, International Preliminary Report on Patentability dated Feb. 16, 2012", 6 pgs.
"International Application Serial No. PCT/US2010/002166, International Search Report dated Feb. 8, 2011", 3 pgs.
"International Application Serial No. PCT/US2010/002166, Written Opinion dated Feb. 28, 2011", 4 pgs.
"International Application Serial No. PCT/US2011/051994, International Preliminary Report on Patentability dated Mar. 28, 2013", 8 pgs.
"International Application Serial No. PCT/US2011/051994, International Search Report dated Apr. 16, 2012", 3 pgs.
"International Application Serial No. PCT/US2011/051994, Written Opinion dated Apr. 16, 2012", 6 pgs.
"International Application Serial No. PCT/US2011/052006, International Preliminary Report on Patentability dated Mar. 28, 2013", 7 pgs.
"International Application Serial No. PCT/US2011/052006, Search Report dated Apr. 16, 2012", 3 pgs.
"International Application Serial No. PCT/US2011/052006, Written Opinion dated Apr. 16, 2012", 5 pgs.
"International Application Serial No. PCT/US2011/052059, International Preliminary Report on Patentability dated Jan. 22, 2013", 14 pgs.
"International Application Serial No. PCT/US2011/052059, Search Report dated Apr. 20, 2012", 4 pgs.
"International Application Serial No. PCT/US2011/052059, Written Opinion dated Apr. 20, 2012", 7 pgs.
"International Application Serial No. PCT/US2011/052060, International Preliminary Report on Patentability dated Jan. 22, 2013", 12 pgs.
"International Application Serial No. PCT/US2011/052060, International Search Report dated Apr. 20, 2012", 3 pgs.
"International Application Serial No. PCT/US2011/052060, Written Opinion dated Apr. 20, 2012", 7 pgs.
"International Application Serial No. PCT/US2011/052061, International Preliminary Report on Patentability dated Mar. 28, 2013", 6 pgs.
"International Application Serial No. PCT/US2011/052061, International Search Report dated Apr. 10, 2012", 3 pgs.
"International Application Serial No. PCT/US2011/052061, Written Opinion dated Apr. 10, 2012", 4 pgs.
"International Application Serial No. PCT/US2011/052064, International Preliminary Report on Patentability dated Mar. 28, 2013", 5 pgs.
"International Application Serial No. PCT/US2011/052064, Search Report dated Feb. 29, 2012", 3 pgs.
"International Application Serial No. PCT/US2011/052064, Written Opinion dated Feb. 29, 2012", 3 pgs.
"International Application Serial No. PCT/US2011/052065, International Preliminary Report on Patentability dated Mar. 28, 2013", 7 pgs.
"International Application Serial No. PCT/US2011/052065, International Search Report dated Apr. 10, 2012", 3 pgs.
"International Application Serial No. PCT/US2011/052065, Written Opinion dated Apr. 10, 2012", 5 pgs.
"International Application Serial No. PCT/US2011/052340, International Preliminary Report on Patentability dated Apr. 4, 2013", 5 pgs.
"International Application Serial No. PCT/US2011/052340, Search Report dated Feb. 29, 2012", 3 pgs.
"International Application Serial No. PCT/US2011/052340, Written Opinion dated Feb. 29, 2012", 3 pgs.
"International Application Serial No. PCT/US2011/052369, International Preliminary Report on Patentability dated Apr. 4, 2013", 5 pgs.
"International Application Serial No. PCT/US2011/052369, International Search Report dated Apr. 24, 2012", 6 pgs.
"International Application Serial No. PCT/US2011/052369, Written Opinion dated Apr. 24, 2012", 3 pgs.
"International Application Serial No. PCT/US2011/052417, International Preliminary Report on Patentability dated Apr. 4, 2013", 6 pgs.
"International Application Serial No. PCT/US2011/052417, International Search Report dated Apr. 23, 2012", 5 pgs.
"International Application Serial No. PCT/US2011/052417, Written Opinion dated Apr. 23, 2012", 4 pgs.
"International Application Serial No. PCT/US2013/021411, International Preliminary Report on Patentability dated Aug. 14, 2014", 7 pgs.
"international Application Serial No. PCT/US2013/021411, International Search Report dated Apr. 30, 2013", 5 pgs.
"International Application Serial No. PCT/US2013/021411, Written Opinion dated Apr. 30, 2013", 5 pgs.
"International Application Serial No. PCT/US2013/023877, International Preliminary Report on Patentability dated Aug. 14, 2014", 7 pgs.
"International Application Serial No. PCT/US2013/023877, International Search Report dated May 14, 2013", 3 pgs.
"International Application Serial No. PCT/US2013/023877, Written Opinion dated May 14, 2013", 5 pgs.
"International Application Serial No. PCT/US2013/024138, International Preliminary Report on Patentability dated Aug. 14, 2014", 6 pgs.

(56) References Cited

OTHER PUBLICATIONS

"International Application Serial No. PCT/US2013/024138, International Search Report dated May 24, 2013", 3 pgs.
"International Application Serial No. PCT/US2013/024138, Written Opinion dated May 24, 2013", 4 pgs.
"International Application Serial No. PCT/US2013/024149, Written Opinion mailed", 4 pages.
"International Application Serial No. PCT/US2013/024149, International Preliminary Report on Patentability dated Aug. 14, 2014", 6 pgs.
"International Application Serial No. PCT/US2013/024149, International Search Report mailed", 7 pages.
"Korean Application Serial No. 10-2013-0036907, Amendment filed Jul. 21, 2015", Not in English, 12 pgs.
"Korean Application Serial No. 10-2013-0109990, Amendment filed Dec. 10, 2013", 4 pgs.
"Korean Application Serial No. 10-2013-7009775, Office Action dated Sep. 17, 2013", w/English Translation, 6 pgs.
"Korean Application Serial No. 10-2013-7009775, Office Action dated Dec. 27, 2013", 8 pgs.
"Korean Application Serial No. 10-2013-7009775, Response filed Oct. 29, 2013 to Office Action dated Sep. 17, 2013", w/English Claims, 23 pgs.
"Korean Application Serial No. 10-2013-700977, Office Action dated Jan. 27, 2017", 5 pgs.
"Korean Application Serial No. 10-2013-7009777, Office Action dated Sep. 17, 2013", w/English Translation, 8 pgs.
"Korean Application Serial No. 10-2013-7009777, Response filed Apr. 28, 2014", w/English Claims, 19 pgs.
"Korean Application Serial No. 10-2013-7009777, Response filed Nov. 5, 2013 to Office Action dated Sep. 17, 2013", 11 pgs.
"Korean Application Serial No. 10-2013-7009788, Office Action dated Aug. 29, 2013", w/English Translation, 6 pgs.
"Korean Application Serial No. 10-2013-7009788, Office Action dated Dec. 27, 2013", w/English Translation, 10 pgs.
"Korean Application Serial No. 10-2013-7009788, Response filed Oct. 29, 2013 to Office Action dated Aug. 29, 2013", w/English Claims, 22 pgs.
"Korean Application Serial No. 10-2013-7009790, Office Action dated Jun. 26, 2013", W/English Translation, 7 pgs.
"Korean Application Serial No. 10-2013-7009790, Response filed Aug. 26, 2013 to Office Action dated Jun. 26, 2013", w/English Claims, 11 pgs.
"Korean Application Serial No. 10-2013-7010143, Office Action dated May 28, 2013", w/English Translation, 5 pgs.
"Korean Application Serial No. 10-2013-7010143, Response filed Jul. 24, 2013 to Office Action dated May 28, 2013", w/English Claims, 14 pgs.
"Korean Application Serial No. 2012-7005729, Office Action dated May 3, 2016", w/ English Claims, 11 pgs.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Beyne, E, et al., "Through-silicon via and die stacking technologies for microsystems-integration", IEEE International Electron Devices Meeting, 2008. IEDM 2008., (Dec. 2008), 1-4.

Cabruja, Enric, et al., "Piezoresistive Accelerometers for MCM-Package-Part II", The Packaging Journal of Microelectrorriechanical Systems. vol. 14, No. 4, (Aug. 2005), 806-811.
Dunn, C, et al., "Efficient linearisation of sigma-delta modulators using single-bit dither", Electronics Letters 31(12), (Jun. 1995), 941-942.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Ferreira, Antoine, et al., "A Survey of Modeling and Control Techniques for Micro- and Nanoelectrornechanical Systems", IEEE Transactions on Systems, Man and Cybernetics Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Reljin, Branimir D, "Properties of SAB filters with the two-pole single-zero compensated operational amplifier", Circuit Theory and Applications: Letters to the Editor. vol. 10, (1982), 277-297.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
Sebastiano, Fabio, et al., "A 1.2-V 10-μW NPN-Based Temperature Sensor in 65-nm CMOS With an Inaccuracy of 0.2 C (3) From -70 C to 125 C", IEEE Journal of Solid-State Circuits, vol. 45, No. 12, Dec. 2010, (Dec. 1, 2010), 2591-2601.
Sedra, Adel, et al., "Chapter 8.9: Effect of Feedback on the Amplifier Poles", Microelectronic Circuits, 5th edition, (2004), 836-864.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/18682/57138272.pdf? . . . >, (Jan. 1, 2004), 123 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 13/742,994, Notice of Allowability dated Sep. 1, 2016", 7 pgs.
"U.S. Appl. No. 13/742,994, Notice of Allowance dated Jun. 21, 2016", 8 pgs.
"U.S. Appl. No. 13/821,589, Non Final Office Action dated Sep. 9, 2016", 7 pgs.
"U.S. Appl. No. 13/821,598, Examiner Interview Summary dated Jul. 21, 2016", 2 pgs.
"U.S. Appl. No. 13/821,598, Examiner Interview Summary dated Jul. 28, 2016", 2 pgs.
"U.S. Appl. No. 13/857,363, Non Final Office Action dated Aug. 5, 2016", 8 pgs.
"U.S. Appl. No. 13/857,377, Response filed Jul. 27, 2016 to Non Final Office Action dated Apr. 27, 2016", 14 pgs.
"U.S. Appl. No. 13/860,780, Final Office Action dated Aug. 18, 2016", 25 pgs.
"U.S. Appl. No. 13/860,780, Response filed Jul. 14, 2016 to Non Final Office Action dated Apr. 14, 2016", 12 pgs.

(56) References Cited

OTHER PUBLICATIONS

"U.S. Appl. No. 14/658,579, Final Office Action dated Jul. 14, 2016", 6 pgs.

"U.S. Appl. No. 15/218,852, Preliminary Amendment filed Jul. 27. 2016", 7 pgs.

"Chinese Application Serial No. 201180055630.3, Response filed Sep. 26, 2016 to Office Action dated May 26, 2016", (With English Translation), 15 pgs.

"Chinese Application Serial No. 201180055794.6, Voluntary Amendment filed Jul. 7, 2015", with English translation of claims, 9 pgs.

"Chinese Application Serial No. 201180055823.9, Office Action dated May 10, 2016", w/ English Translation, 8 pgs.

"Chinese Application Serial No. 201180055823.9, Response filed Jul. 25, 2016 to Office Action dated May 10, 2016", with English translation of claims, 17 pgs.

"Chinese Application Serial No. 201310119806.8, Response filed Sep. 28, 2016 to Office Action dated May 13, 2016", with English translation of claims, 13 pgs.

"Chinese Application Serial No. 201310120172.8, Office Action dated Aug. 1, 2016", with English translation of claims, 19 pgs.

"Chinese Application Serial No. 201310415336.X, Response filed Sep. 12, 2016 to Office Action dated Apr. 26, 2016", W/ English Translation of Claims, 13 pgs.

"Definition of baseband signal downloaded from Tech Terms", (Jul. 15, 2016), 1 pg.

"European Application Serial No. 11827357.2, Communication under Rule 71(3) dated Apr. 25, 2016", 36 pgs.

"European Application Serial No. 13001694.2, Response filed Apr. 26, 2016 to Office Action dated Oct. 2, 2015", 18 pgs.

"European Application Serial No. 13001719.7, Communication Pursuant to Article 94(3) EPC dated Jul. 4, 2016", 4 pgs.

"European Application Serial No. 13001918.5, Response filed Jul. 8, 2016 tp Office Action dated Dec. 3, 2015", 36 pgs.

"Explanation of phase shifters from "Microwaves 101"", (Aug. 4, 2016), 5 pgs.

"Korean Application Serial No. 2012-7005729, Response filed Jun. 29, 2016 to Office Action dated May 3, 2016", (English Translation of Claims), 29 pgs.

\* cited by examiner

MICROMACHINED MONOLITHIC 3-AXIS GYROSCOPE WITH SINGLE DRIVE

CLAIM OF PRIORITY

This application is a continuation of U.S. patent application Ser. No. 13/821,842, filed on Jul. 2, 2013, and issued as U.S. Pat. No. 9,246,018 on Jan. 26, 2016, which is a U.S. National Stage Filing under 35 U.S.C. 371 from International Patent Application Serial No. PCT/US2011/052065, filed on Sep. 18, 2011, and published on Mar. 22, 2012 as WO 2012/037540 A2, which claims the benefit of priority of Acar, U.S. Provisional Patent Application Ser. No. 61/384,245, entitled "MICROMACHINED MONOLITHIC 3-AXIS GYROSCOPE WITH SINGLE DRIVE," filed on Sep. 18, 2010, and the benefit of priority of Acar, U.S. Provisional Patent Application Ser. No. 61/384,246, entitled "MICROMACHINED 3-AXIS ACCELEROMETER WITH A SINGLE PROOF-MASS," filed on Sep. 18, 2010, each of which are hereby incorporated by reference herein in its entirety.

Further, this application is related to Acar et al., U.S. patent application Ser. No. 12/849,742, entitled "MICROMACHINED INERTIAL SENSOR DEVICES," filed on Aug. 3, 2010 and to Marx et al., U.S. patent application Ser. No. 12/849,787, entitled "MICROMACHINED DEVICES AND FABRICATING THE SAME," filed Aug. 3, 2010, each of which is hereby incorporated by reference herein in its entirety.

TECHNICAL FIELD

The present invention relates generally to inertial sensor devices and more particularly to micromachined inertial sensor devices.

BACKGROUND

Several single-axis or multi-axis micromachined gyroscope structures have been integrated into a system to form a 3-axis gyroscope cluster. However, the size and cost of such clusters consisting of separate sensors can be excessive for certain applications. Even though single or multi-axis gyroscopes can be fabricated on a single MEMS chip, separate drive and sense electronics are required for each sensor.

Further, the demand for three axis acceleration detection in consumer/mobile, automotive and aerospace/defense applications is constantly increasing. Many single-axis or multi-axis micromachined accelerometer structures have utilized separate proof-masses for each acceleration axis. Combining multiple sensors or multiple proof-masses on a die can drive up both the size and cost of the integrated three-axis accelerometer sensor.

OVERVIEW

This document discusses, among other things, a cap wafer and a via wafer configured to encapsulate a single proof-mass 3-axis gyroscope formed in an x-y plane of a device layer. The single proof-mass 3-axis gyroscope can include a main proof-mass section suspended about a single, central anchor, the main proof-mass section including a radial portion extending outward towards an edge of the 3-axis gyroscope sensor, a central suspension system configured to suspend the 3-axis gyroscope from the single, central anchor, and a drive electrode including a moving portion and a stationary portion, the moving portion coupled to the radial portion, wherein the drive electrode and the central suspension system are configured to oscillate the 3-axis gyroscope about a z-axis normal to the x-y plane at a drive frequency.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, a micromachined monolithic 3-axis gyroscope configured to utilize a single center-anchored proof-mass to detect angular rate about all three axes while effectively decoupling the response modes for each axis to minimize cross-axis sensitivity.

In an example, the unique proof-mass partitioning and flexure structure disclosed herein can allow 3-axis angular rate detection utilizing a single drive-mode oscillation, which can require only one drive control loop for all axes. Thus, in contrast to existing multi-axis gyroscopes that use three separate drive loops, complexity and cost of control electronics of the 3-axis gyroscope disclosed herein can be significantly reduced.

Further, the present inventor has recognized, among other things, a micromachined 3-axis accelerometer configured to utilize a single center-anchored proof-mass to detect accelerations about all three axes while effectively decoupling the response modes for each axis to minimize cross-axis sensitivity.

In an example, the unique proof-mass and flexure structure disclosed herein can allow 3-axis acceleration detection using a single center anchored proof-mass. Thus, in contrast to existing multi-axis accelerometers that utilize separate proof-masses for each acceleration axis, the overall die size and the total cost of the microelectromechanical system (MEMS) sensing element of the 3-axis accelerometer disclosed herein can be significantly reduced.

Device Structure

Figure 1:
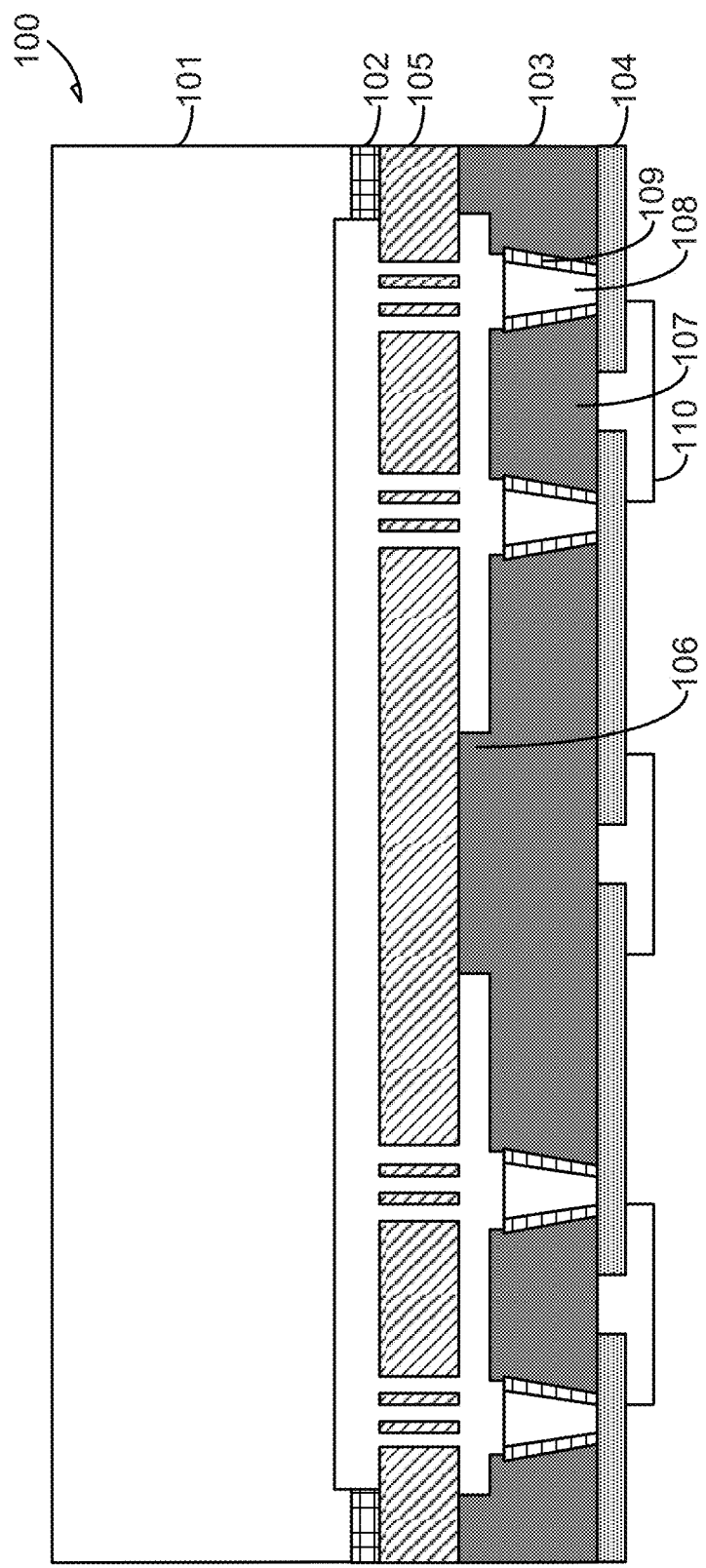
FIG. 1 illustrates generally a schematic cross sectional view of a 3-degrees-of-freedom (3-DOF) inertial measurement unit (IMU).

FIG. 1 illustrates generally a schematic cross sectional view of a 3-degrees-of-freedom (3-DOF) inertial measurement unit (IMU) 100, such as a 3-DOF gyroscope or a 3-DOF micromachined accelerometer, formed in a chip-scale package including a cap wafer 101, a device layer 105 including micromachined structures (e.g., a micromachined 3-DOF IMU), and a via wafer 103. In an example, the device layer 105 can be sandwiched between the cap wafer 101 and the via wafer 103, and the cavity between the device layer 105 and the cap wafer 101 can be sealed under vacuum at the wafer level.

In an example, the cap wafer 101 can be bonded to the device layer 105, such as using a metal bond 102. The metal bond 102 can include a fusion bond, such as a non-high temperature fusion bond, to allow getter to maintain long term vacuum and application of anti-stiction coating to prevent stiction that can occur to low-g acceleration sensors. In an example, during operation of the device layer 105, the metal bond 102 can generate thermal stress between the cap wafer 101 and the device layer 105. In certain examples, one or more features can be added to the device layer 105 to isolate the micromachined structures in the device layer 105 from thermal stress, such as one or more stress reducing grooves formed around the perimeter of the micromachined structures. In an example, the via wafer 103 can be bonded to the device layer 105, such as fusion bonded (e.g., silicon-silicon fusion bonded, etc.), to obviate thermal stress between the via wafer 103 and the device layer 105.

In an example, the via wafer 103 can include one or more isolated regions, such as a first isolated region 107, isolated from one or more other regions of the via wafer 103, for example, using one or more through-silicon-vias (TSVs), such as a first TSV 108 insulated from the via wafer 103 using a dielectric material 109. In certain examples, the one or more isolated regions can be utilized as electrodes to sense or actuate out-of-plane operation modes of the 6-axis inertial sensor, and the one or more TSVs can be configured to provide electrical connections from the device layer 105 outside of the system 100. Further, the via wafer 103 can include one or more contacts, such as a first contact 110, selectively isolated from one or more portions of the via wafer 103 using a dielectric layer 104 and configured to provide an electrical connection between one or more of the isolated regions or TSVs of the via wafer 103 to one or more external components, such as an ASIC wafer, using bumps, wire bonds, or one or more other electrical connection.

In certain examples, the 3-degrees-of-freedom (3-DOF) gyroscope or the micromachined accelerometer in the device layer 105 can be supported or anchored to the via wafer 103 by bonding the device layer 105 to a protruding portion of the via wafer 103, such as an anchor 106. In an example, the anchor 106 can be located substantially at the center of the via wafer 103, and the device layer 105 can be fusion bonded to the anchor 106, such as to eliminate problems associated with metal fatigue.

Gyroscope Device Structure

Figure 2:
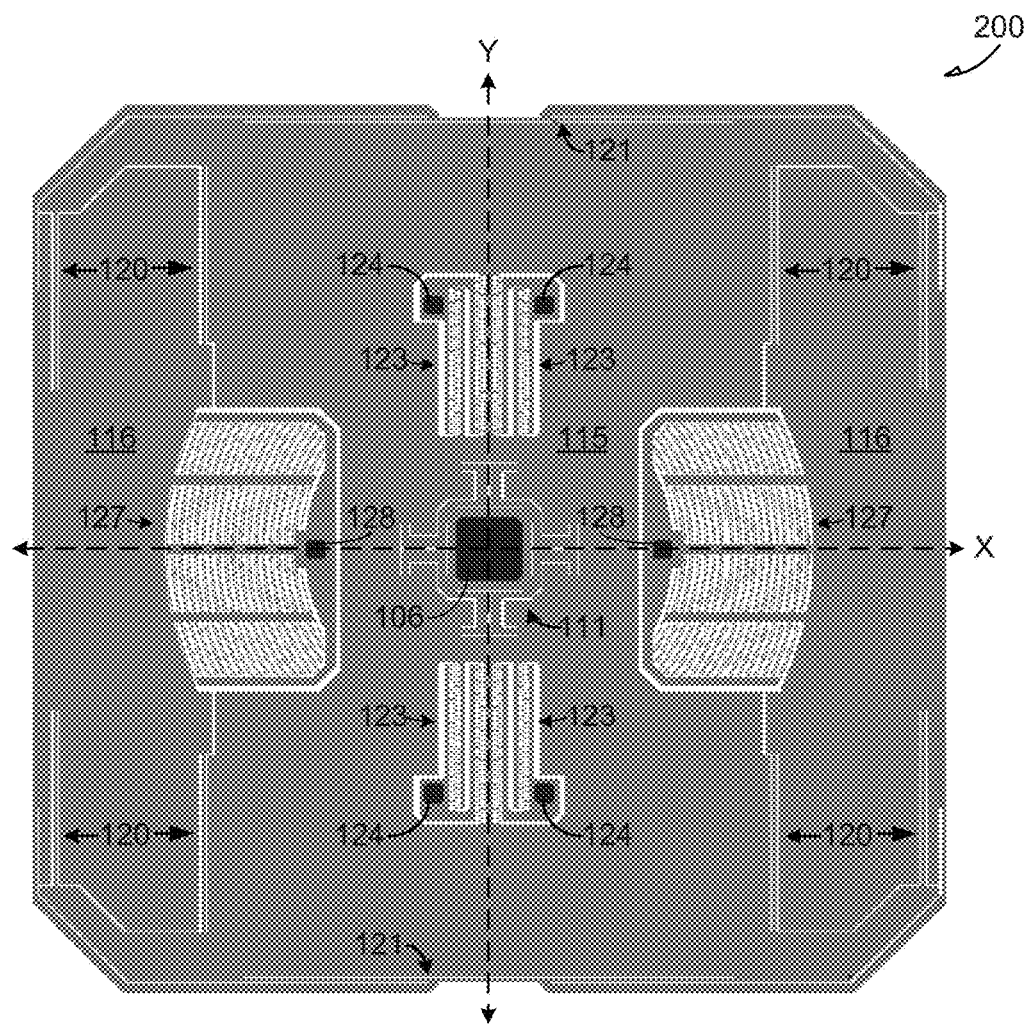
FIG. 2 illustrates generally an example of a 3-axis gyroscope.

FIG. 2 illustrates generally an example of a 3-axis gyroscope 200, such as formed in a single plane of a device layer 105 of a 3-DOF IMU 100. In an example, the structure of the 3-axis gyroscope 200 can be symmetrical about the x and y axes illustrated in FIG. 2, with a z-axis conceptually coming out of the figure. Reference in FIG. 2 is made to structure and features in one portion of the 3-axis gyroscope 200. However, in certain examples, such reference and description can apply to unlabeled like portions of the 3-axis gyroscope 200.

In an example, the 3-axis gyroscope 200 can include a single proof-mass design providing 3-axis gyroscope operational modes patterned into the device layer 105 of the 3-DOF IMU 100, such as illustrated in the example of FIG. 1.

Figure 3:
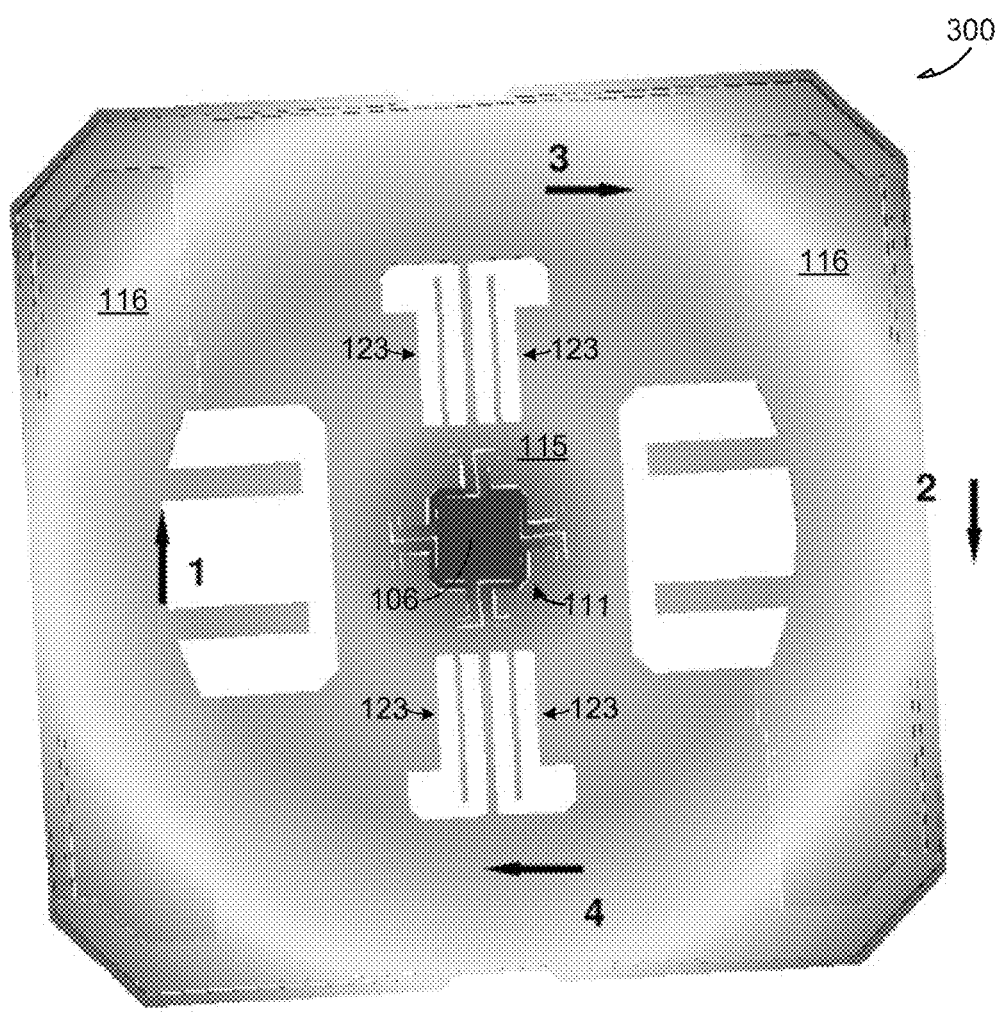
FIG. 3 illustrates generally an example of a 3-axis gyroscope in drive motion.
Figure 4:
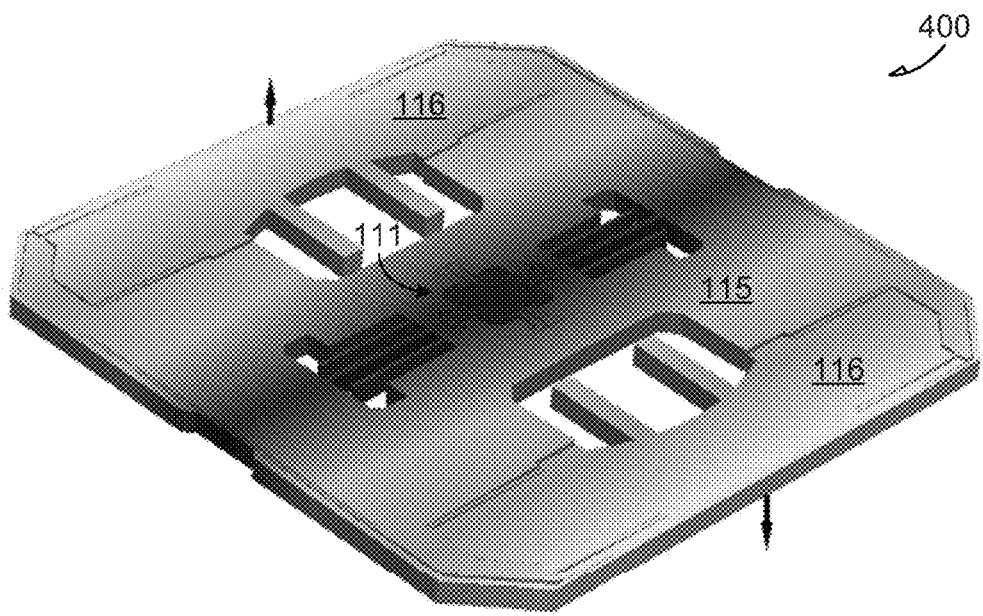
FIG. 4 illustrates generally an example of a 3-axis gyroscope including a single proof-mass during sense motion in response to rotation about the x-axis.
Figure 5:
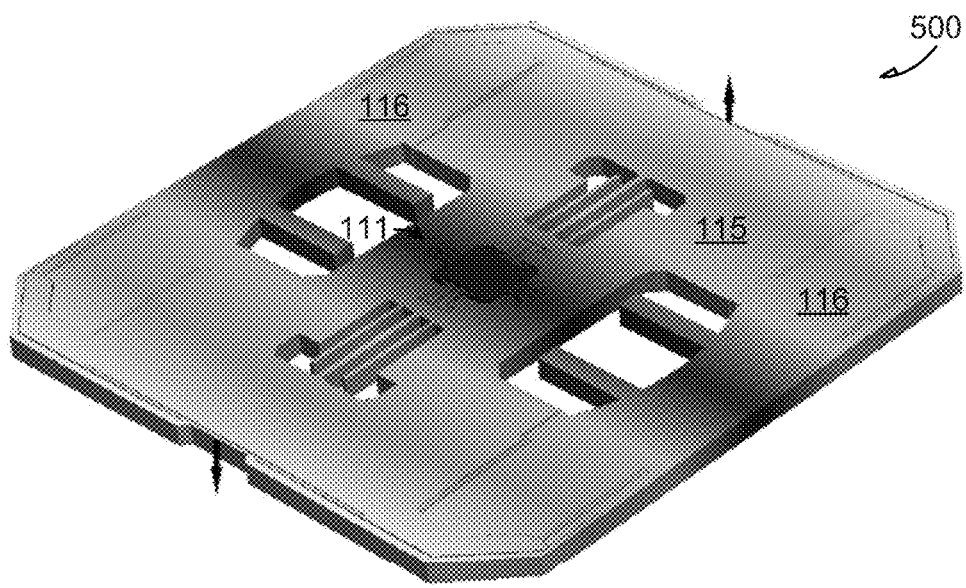
FIG. 5 illustrates generally an example of a 3-axis gyroscope including a single proof-mass during sense motion in response to rotation about the y-axis.

In an example, the single proof-mass can be suspended at its center using a single central anchor (e.g., anchor 106) and a central suspension 111 including symmetrical central flexure bearings ("flexures"), such as disclosed in the copending Acar et al., PCT Patent Application Serial No. US2011052006, entitled "FLEXURE BEARING TO REDUCE QUADRATURE FOR RESONATING MICROMACHINED DEVICES," filed on Sep. 16, 2011, which is hereby incorporated by reference in its entirety. The central suspension 111 can allow the single proof-mass to oscillate torsionally about the x, y, and z axes, providing three gyroscope operational modes, including:

(1) Torsional in-plane drive motion about the z-axis e.g., as illustrated in FIG. 3);

(2) Torsional out-of-plane y-axis gyroscope sense motion about the x-axis (e.g., as illustrated in FIG. 4); and (3) Torsional out-of-plane x-axis gyroscope sense motion about the y-axis (e.g., as illustrated in FIG. 5).

Further, the single proof-mass design can be composed of multiple sections, including, for example, a main proof-mass section 115 and x-axis proof-mass sections 116 symmetrical about the y-axis. In an example, drive electrodes 123 can be placed along the y-axis of the main proof-mass section 115. In combination with the central suspension 111, the drive electrodes 123 can be configured to provide a torsional in-plane drive motion about the z-axis, allowing detection of angular motion about the x and y axes.

In an example, the x-axis proof-mass sections 116 can be coupled to the main proof-mass section 115 using z-axis gyroscope flexure bearings 120. In an example, the z-axis gyroscope flexure bearings 120 can allow the x-axis proof-mass sections 116 to oscillate linear anti-phase in the x-direction for the z-axis gyroscope sense motion.

Further, the 3-axis inertial sensor 200 can include z-axis gyroscope sense electrodes 127 configured to detect anti-phase, in-plane motion of the x-axis proof-mass sections 116 along the x-axis.

In an example, each of the drive electrodes 123 and z-axis gyroscope sense electrodes 127 can include moving fingers coupled to one or more proof-mass sections interdigitated with a set of stationary fingers fixed in position (e.g., to the via wafer 103) using a respective anchor, such as anchors 124, 128.

Gyroscope Operational Modes

FIG. 3 illustrates generally an example of a 3-axis gyroscope 300 in drive motion. In an example, the drive electrodes 123 can include a set of moving fingers coupled to the main proof-mass section 115 interdigitated with a set of stationary fingers fixed in position using a first drive anchor 124 (e.g., a raised and electrically isolated portion of the via wafer 103). In an example, the stationary fingers can be configured to receive energy through the first drive anchor 124, and the interaction between the interdigitated moving and stationary fingers of the drive electrodes 123 can be configured to provide an angular force to the single proof-mass about the z-axis.

In the example of FIG. 3, the drive electrodes 123 are driven to rotate the single proof-mass about the z-axis while the central suspension 111 provides restoring torque with respect to the fixed anchor 106, causing the single proof-mass to oscillate torsionally, in-plane about the z-axis at a drive frequency dependent on the energy applied to the drive electrodes 123. In certain examples, the drive motion of the single proof-mass can be detected using the drive electrodes 123.

X-Axis Rate Response

FIG. 4 illustrates generally an example of a 3-axis gyroscope 400 including a single proof-mass during sense motion in response to rotation about the x-axis, the single proof-mass including a main proof-mass section 115, x-axis proof-mass sections 116, and central suspension 111.

In the presence of an angular rate about the x-axis, and in conjunction with the drive motion of the 3-axis gyroscope 400 described in the example of FIG. 3, Coriolis forces in opposite directions along the z-axis can be induced on the x-axis proof-mass sections 116 because the velocity vectors are in opposite directions along the y-axis. Thus, the single proof-mass can be excited torsionally about the y-axis by flexing the central suspension 111. The sense response can be detected using out-of-plane x-axis gyroscope sense electrodes, e.g., formed in the via wafer 103 and using capacitive coupling of the x-axis proof-mass sections 116 and the via wafer 103.

Y-Axis Rate Response

FIG. 5 illustrates generally an example of a 3-axis gyroscope 500 including a single proof-mass during sense motion in response to rotation about the y-axis, the single proof-mass including a main proof-mass section 115, x-axis proof-mass sections 116, and central suspension 111.

In the presence of an angular rate about the y-axis, and in conjunction with the drive motion of the 3-axis gyroscope 400 described in the example of FIG. 3, Coriolis forces in opposite directions along the z-axis can be induced on the main proof-mass section 115 because the velocity vectors are in opposite directions along the x-axis. Thus, the single proof-mass can be excited torsionally about the x-axis by flexing the central suspension 111. The sense response can be detected using out-of-plane y-axis gyroscope sense electrodes, e.g., formed in the via wafer 103 and using capacitive coupling of the main proof-mass section 115 and the via wafer 103.

Z-Axis Rate Response

Figure 6:
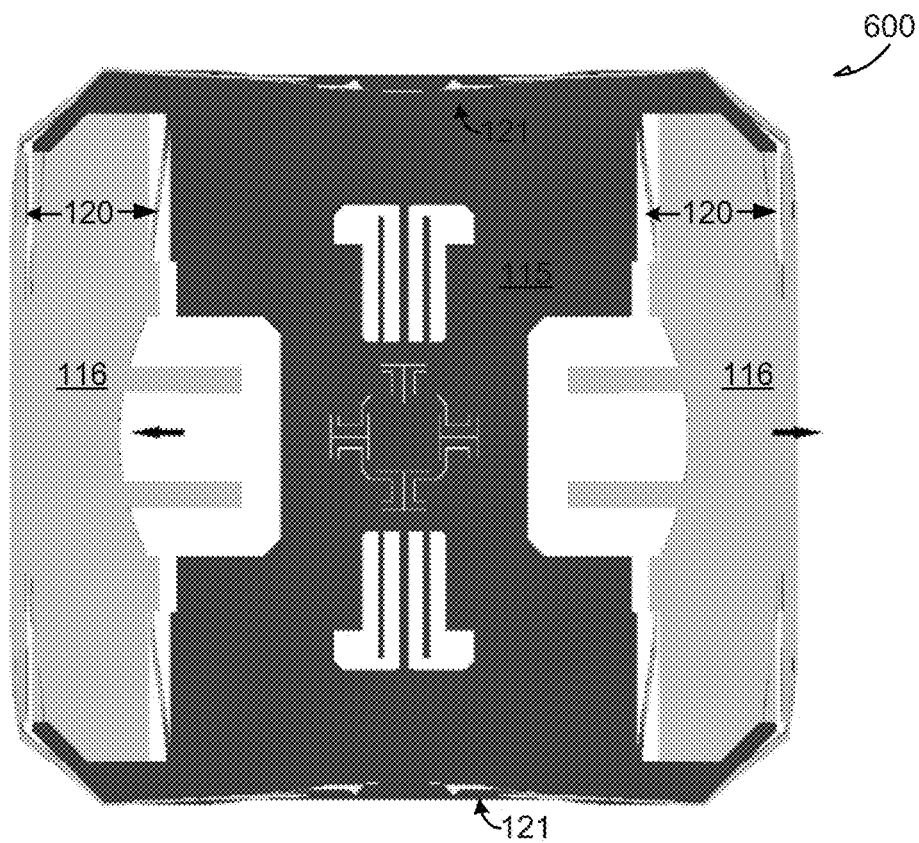
FIG. 6 illustrates generally an example of a 3-axis gyroscope including a single proof-mass during sense motion in response to rotation about the z-axis.

FIG. 6 illustrates generally an example of a 3-axis gyroscope 600 including a single proof-mass during sense motion in response to rotation about the z-axis, the single proof-mass including a main proof-mass section 115, x-axis proof-mass sections 116, central suspension, z-axis flexure bearings 120, and z-axis gyroscope coupling flexure bearings 121.

In the presence of an angular rate about the z-axis, and in conjunction with the drive motion of the 6-axis inertial sensor 400 described in the example of FIG. 3, Coriolis forces in opposite directions along the x-axis can be induced on the x-axis proof-mass sections 116 because the velocity vectors are in opposite directions along the y-axis. Thus, the x-axis proof-mass sections 116 can be excited linearly in opposite directions along the x-axis by flexing the z-axis flexure bearings 120 in the x-direction. Further, the z-axis gyroscope coupling flexure bearings 121 can be used to provide a linear anti-phase resonant mode of the x-axis proof-mass sections 116, which are directly driven by the anti-phase Coriolis forces. The sense response can be detected using in-plane parallel-plate sense electrodes, such as the z-axis gyroscope sense electrodes 127 formed in the device layer 105.

Figure 7:
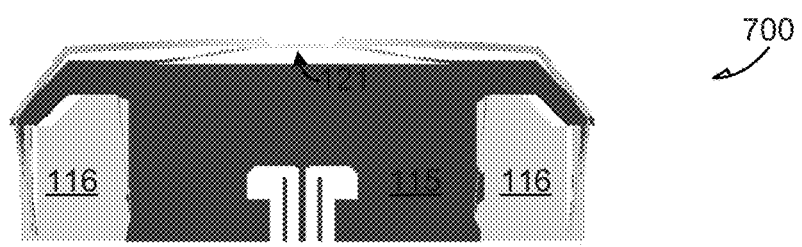
FIGS. 7 and 8 illustrate generally examples of a 3-axis gyroscope including a z-axis gyroscope coupling flexure bearing during anti-phase motion and in-phase motion, respectively.
Figure 8:
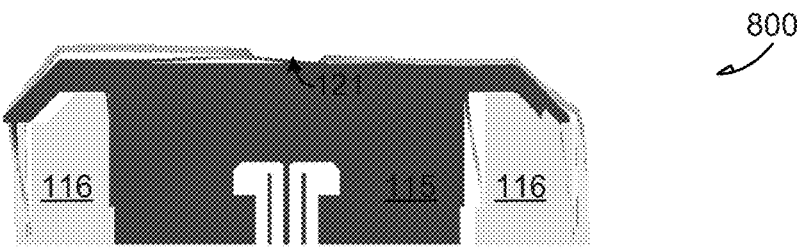

FIGS. 7 and 8 illustrate generally examples of a 3-axis gyroscope 700 including a z-axis gyroscope coupling flexure bearing 121 during anti-phase motion and in-phase motion, respectively. To improve the vibration rejection of the 3-axis gyroscope 700 due to x-axis acceleration, the z-axis gyroscope coupling flexure bearings 121 is configured to suppress in-phase motion of the x-axis proof-mass sections 116.

During the anti-phase motion, the connection beams that connect the two x-axis proof-mass sections 116 to the z-axis gyroscope coupling flexure bearing 121 apply forces in the same direction and the coupling beams undergo a natural bending with low stiffness.

In contrast, during the in-phase motion, the coupling beams of the z-axis gyroscope coupling flexure bearing 121 apply forces in opposite directions on the coupling beams, forcing the coupling beams into a twisting motion with a higher stiffness. Thus, the in-phase motion stiffness and the resonant frequencies are increased, providing better vibration rejection.

Accelerometer Device Structure

Figure 9:
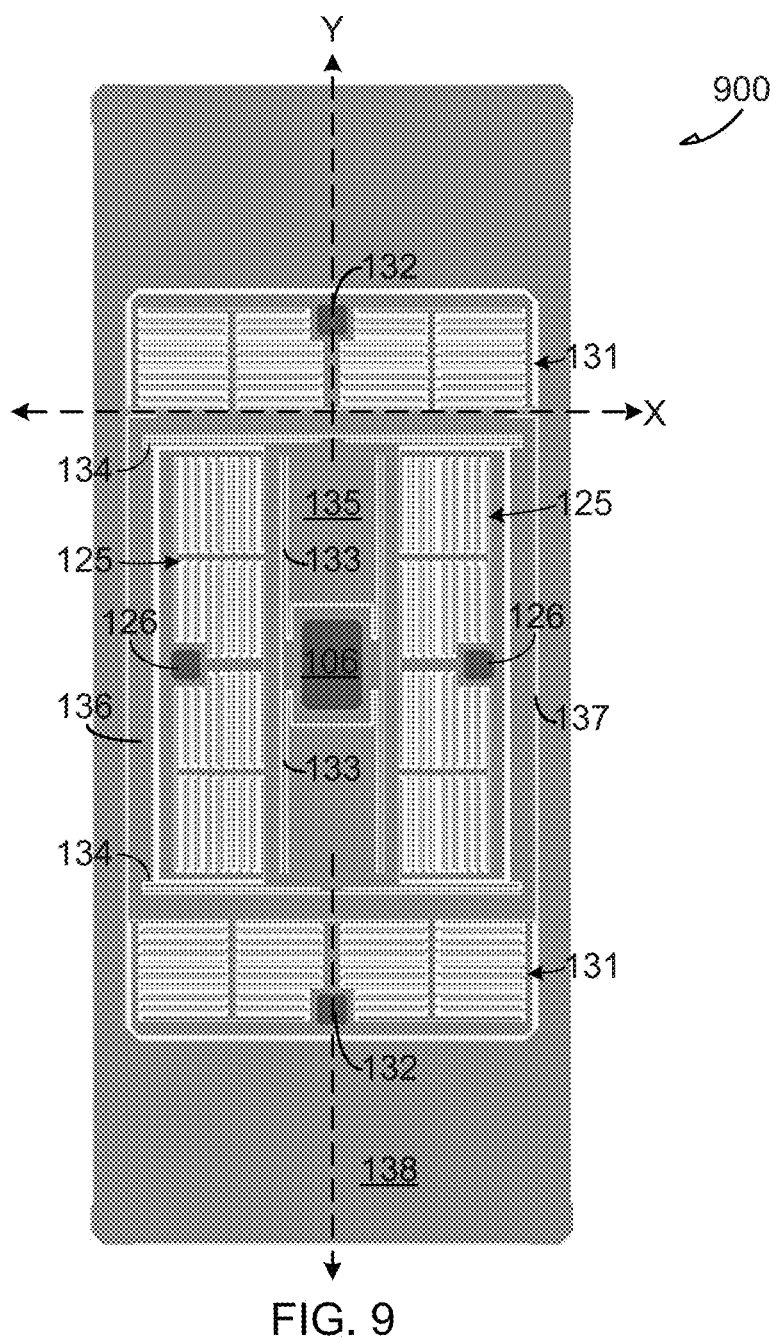
FIG. 9 illustrates generally an example of a 3-axis accelerometer.

FIG. 9 illustrates generally an example of a 3-axis accelerometer 900, such as formed in a single plane of a device layer 105 of a 3-DOF IMU 100. In an example, the 3-axis accelerometer 900 can include a single proof-mass design, providing 3-axis accelerometer operational modes patterned into the device layer 105 of the 3-DOF IMU 100, such as illustrated in the example of FIG. 1.

In an example, the single proof-mass can be suspended at its center to a single central anchor (e.g., anchor 106) using a series of flexure bearings and frames that aim to decouple the response modes and reduce cross-axis sensitivities. In an example, the 3-axis accelerometer 900 can include x-axis flexure bearings 133 configured to couple the anchor 106 to the x-axis frame 135 and allow the x-axis frame 135 to deflect in response to acceleration along the x-axis. Further, the device can include y-axis flexure bearings 134 configured to couple the x-axis frame 135 to the y-axis frame 136 and allow the y-axis frame 136 to deflect with respect to the x-axis frame 135 in response to accelerations along the y-axis, and z-axis flexure bearings 137 configured to couple the y-axis frame 136 to the remainder of the proof mass 138. The z-axis flexure bearings 137 function as a torsional hinge, allowing the proof-mass to deflect torsionally out-of-plane about the axis that passes through the center of the beams.

Further, the 3-axis accelerometer 900 can include x-axis accelerometer sense electrodes 125 configured to detect in-phase, in-plane x-axis motion of the x-axis frame 135, or y-axis accelerometer sense electrodes 131 configured to detect in-phase, in-plane, y-axis motion of the y-axis frame 136. In an example, each of the x-axis and y-axis accelerometer sense electrodes 125, 131 can include moving fingers coupled to one or more frame sections interdigitated with a set of stationary fingers fixed in position (e.g., to the via wafer 103) using a respective anchor, such as anchors 126, 132.

X-Axis Accelerometer Response

Figure 10:
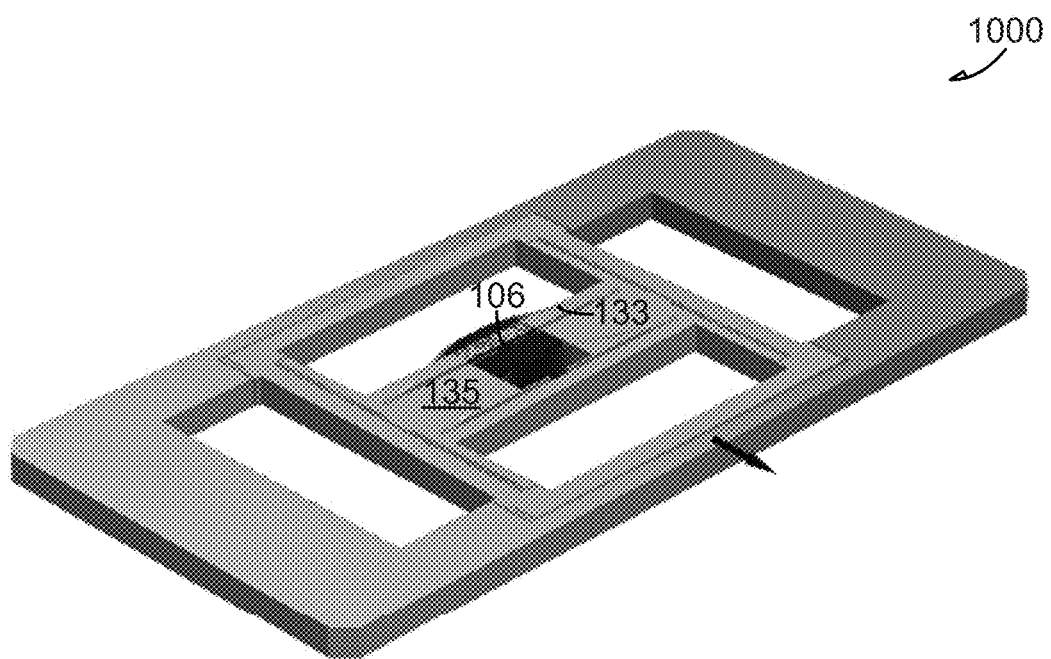
FIG. 10 illustrates generally an example of a 3-axis accelerometer in sense motion response to an x-axis acceleration.

FIG. 10 illustrates generally an example of a 3-axis accelerometer 1000 in sense motion in response to an x-axis acceleration, the 3-axis accelerometer including a single proof-mass, an anchor 106, x-axis flexure bearings 133, and an x-axis frame 135.

In the presence of an acceleration along the x-axis, the proof mass, the y-axis frame 136 and the x-axis frame 135 can move in unison with respect to the anchor 106. The resulting motion can be detected using the x-axis accelerometer sense electrodes 125 located on opposite sides of the proof-mass, allowing differential measurement of deflections. In various examples, a variety of detection methods, such as capacitive (variable gap or variable area capacitors), piezoelectric, piezoresistive, magnetic or thermal can be used.

Y-Axis Accelerometer Response

Figure 11:
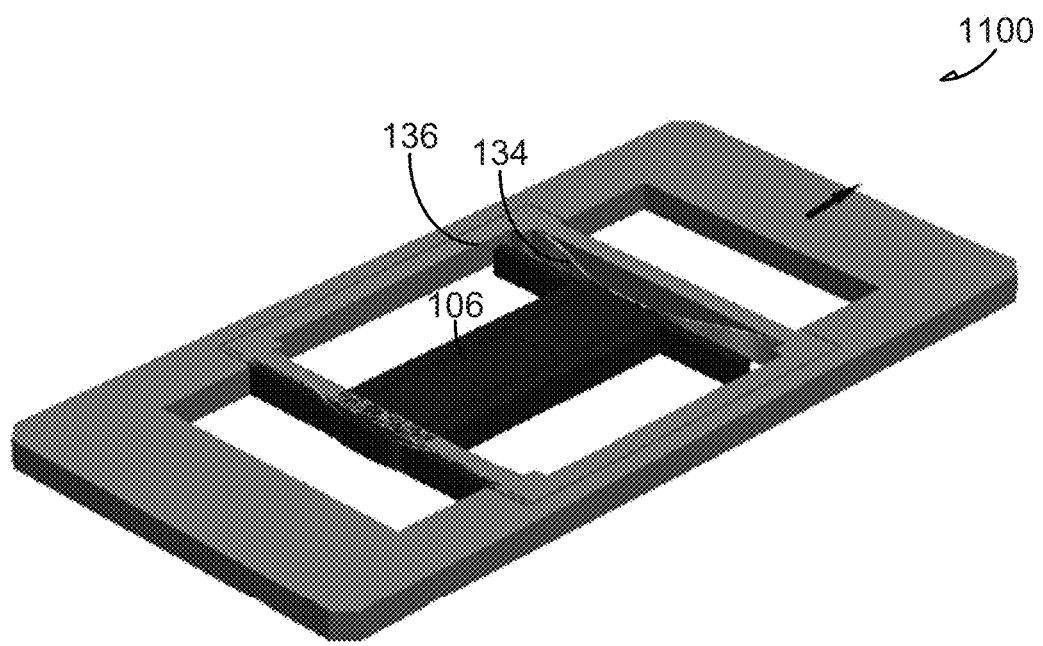
FIG. 11 illustrates generally an example of a 3-axis accelerometer in sense motion in response to a y-axis acceleration.

FIG. 11 illustrates generally an example of a 3-axis accelerometer 1100 in sense motion in response to a y-axis acceleration, the 3-axis accelerometer including a single proof-mass, an anchor 106, y-axis flexure bearings 134, and a y-axis frame 136.

In the presence of an acceleration along the y-axis, the y-axis flexure bearings 134 that connect the y-axis frame 136 to the x-axis frame 135 deflect and allow the y-axis frame 136 to move along the y-axis in unison with the proof-mass, while the x-axis frame remains stationary. The resulting motion can be detected using the y-axis accelerometer sense electrodes 131 located on opposite sides of the proof-mass, allowing differential measurement of deflections. In various examples, a variety of detection methods, such as capacitive (variable gap or variable area capacitors), piezoelectric, piezoresistive, magnetic or thermal can be used.

Z-Axis Accelerometer Response

Figure 12:
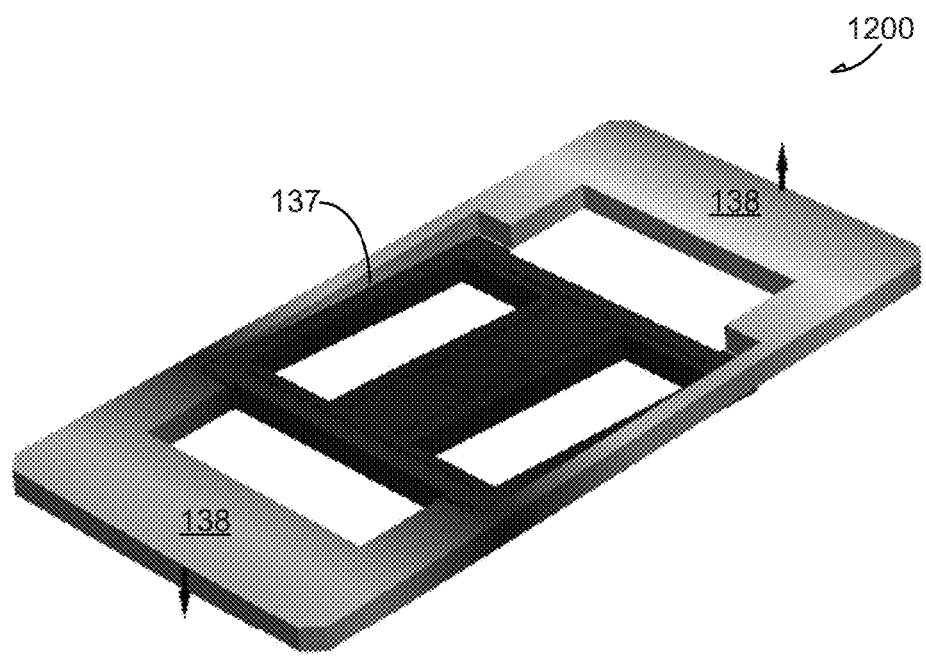
FIG. 12 illustrates generally an example of a 3-axis accelerometer in sense motion in response to a z-axis acceleration.

FIG. 12 illustrates generally an example of a 3-axis accelerometer 1200 in sense motion in response to a z-axis acceleration, the 3-axis accelerometer including a single proof-mass 138, an anchor, and z-axis flexure bearings 137.

In the example of FIG. 12, the x-axis flexure bearings 137 are located such that the axis that passes through the center of the beam is offset from the center of the proof-mass 138. Thus, a mass imbalance is created, so that the portion of the mass that is located further from the pivot line generates a larger inertial moment than the portion located closer, rendering the proof-mass 138 sensitive to z-axis accelerations, deflecting torsionally out-of-plane about the pivot line. The x and y-axis flexure bearings 133, 134 are designed to have high out-of-plane stiffness. Accordingly, they remain stationary during z-axis acceleration.

Figure 13:
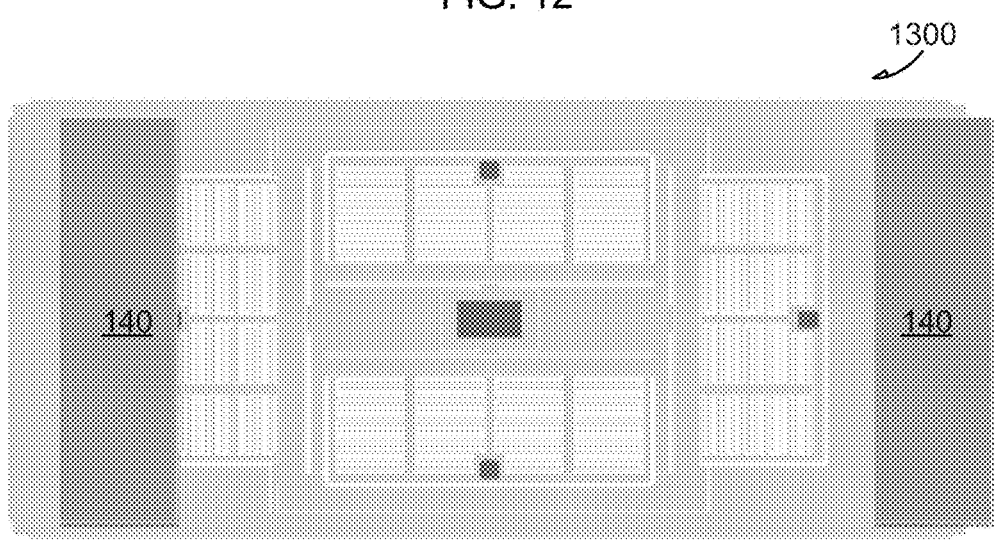
FIG. 13 illustrates generally an example of a system including via wafer electrode placement.

FIG. 13 illustrates generally an example of a system 1300 including via wafer electrode placement. In an example, z-axis accelerometer electrodes 140 can be placed on the via wafer 103 under the device layer 105. The torsional response allows measurement of deflections differentially with only one layer of out-of-plane electrodes. In an example, a variety of detection methods such as capacitive (variable gap or variable area capacitors), piezoelectric, piezoresistive, magnetic or thermal can be employed.

Figure 14:
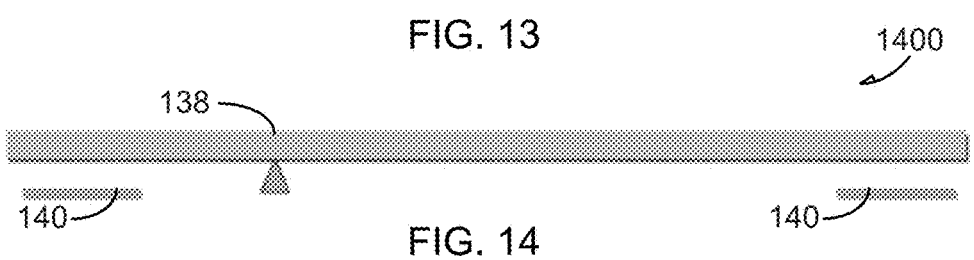
FIG. 14 illustrates generally an example side view of a 3-axis accelerometer including a single proof-mass.

FIG. 14 illustrates generally an example side view of a 3-axis accelerometer 1400 including a single proof-mass, an illustrative "pivot", and z-axis accelerometer electrodes 140.

3+3 DOF

Figure 15:
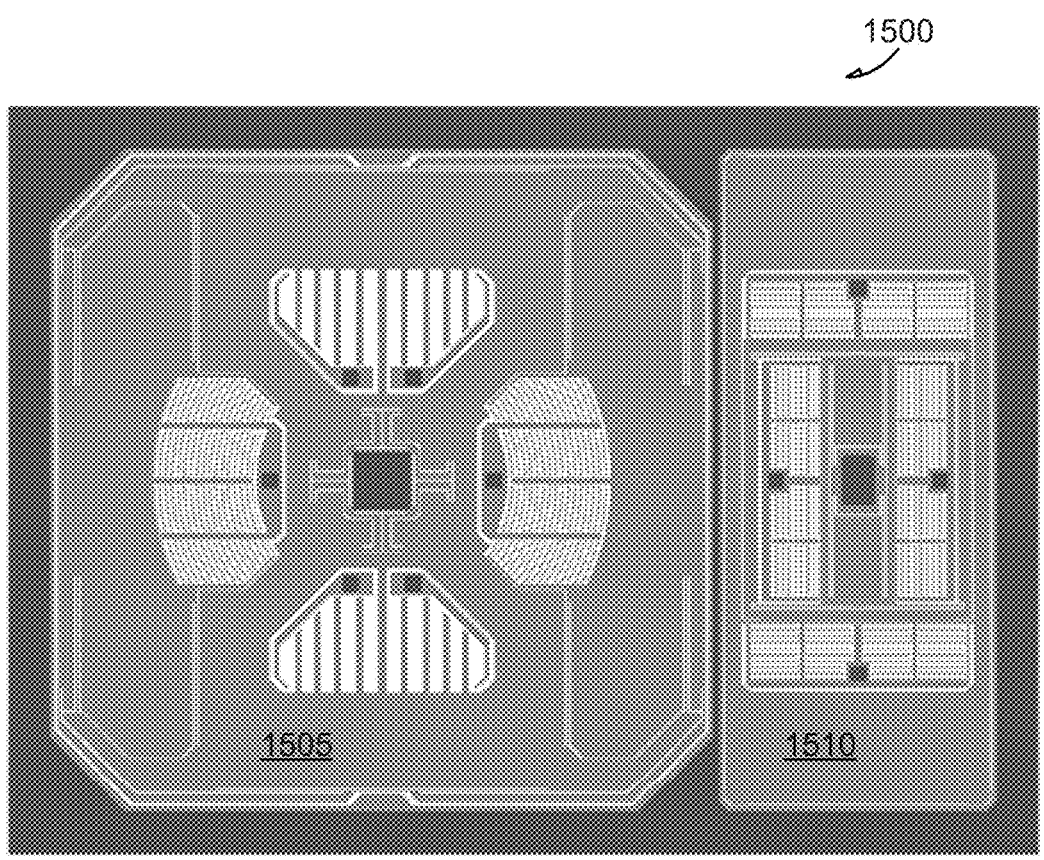
FIG. 15 illustrates generally an example of a 3+3-degrees-of-freedom (3+3 DOF) inertial measurement unit (IMU).

FIG. 15 illustrates generally an example of a. 3+3-degrees-of-freedom (3+3 DOF) inertial measurement unit (IMU) 200 (e.g., a 3-axis gyroscope and a 3-axis accelerometer), such as formed in a single plane of a device layer 105 of an IMU. In an example, the 3+3 DOF can include a 3-axis gyroscope 1505 and a 3-axis accelerometer 1510 on the same wafer.

In this example, each of the 3-axis gyroscope 1505 and the 3-axis accelerometer 1510 have separate proof-masses, though when packaged, the resulting device (e.g., chip-scale package) can share a cap, and thus, the 3-axis gyroscope 1505 and the 3-axis accelerometer 1510 can reside in the same cavity. Moreover, because the devices were formed at similar times and on similar materials, the invention significantly lowers the risk of process variations, reduces the need to separately calibrate the sensors, reduces alignment issues, and allows closer placement than separately bonding the devices near one another.

Further, there is a space savings associated with sealing the resulting device. For example, if a 100 um seal width is required, sharing the cap wafer and reducing the distance between devices allows the overall size of the resulting device to shrink. Packaged separately, the amount of space required for the seal width could double.

In an example, die size can be reduced to 2.48×1.8 mm with a 100 um seal width.

Drive and Detection Frequencies

In an example, the drive mode and the three gyroscope sense modes can be located in the 20 kHz range. For open-loop operation, the drive mode can be separated from the sense-modes by a mode separation, such as 100 Hz to 500 Hz, which can determine the mechanical sensitivity of the gyroscopes. To increase sensitivity, the gyroscope operational resonant frequencies can be reduced if the vibration specifications of the application allow. If closed-loop sense operation is implemented, the mode separation can be reduced to increase mechanical sensitivity further.

Quadrature Error Reduction

Figure 16:
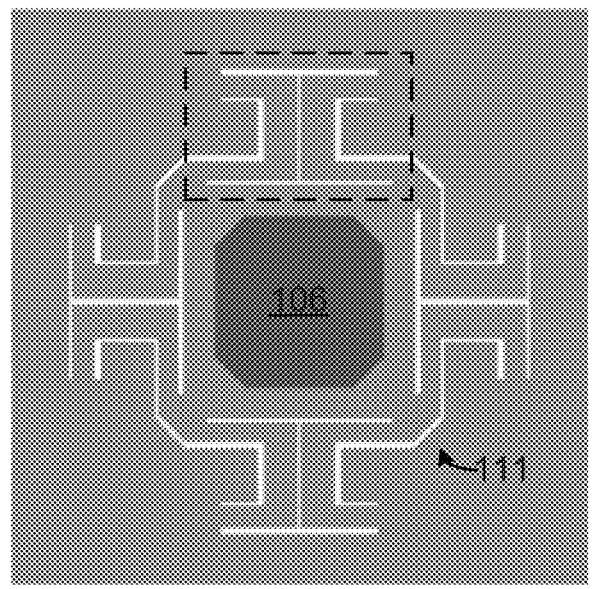
FIG. 16 illustrates generally an example of the central suspension at rest about an anchor.

FIG. 16 illustrates generally an example of the central suspension 111 at rest about an anchor 106, the central suspension 111 including symmetric "C-beams" configured to locally cancel quadrature error. The primary source of quadrature error in micromachined gyroscopes is the DRIE sidewall angle errors, which result in deviation of the etch profile from a straight sidewall. If sidewalls have an angle error, the in-plane drive motion can also cause out-of-plane motion when the skew axis is along beam length. Thus, when skewed compliant beams are located on opposite sides of the drive motion, the resulting out-of-plane deflections cause quadrature error.

Figure 17:
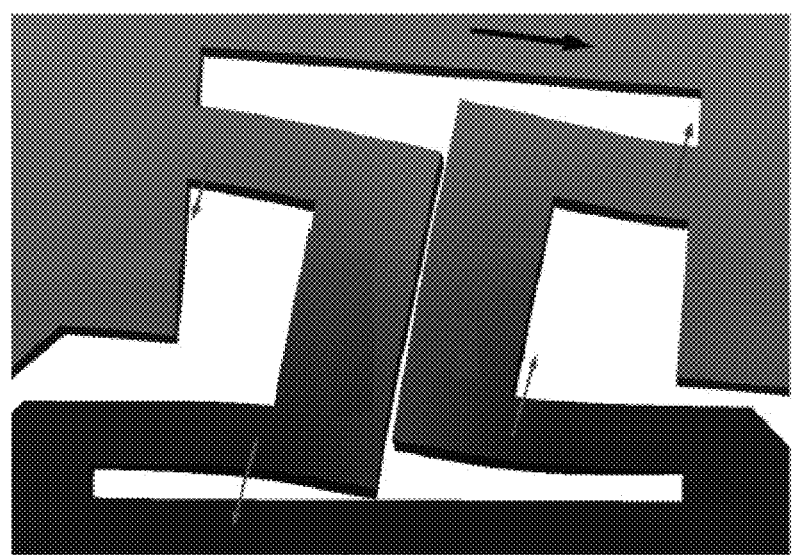
FIG. 17 illustrates generally an example of a portion of the central suspension in drive motion.

FIG. 17 illustrates generally an example of a portion of the central suspension 111 in drive motion. The central suspension 111 utilizes symmetric "C-beams" on each side of the anchor 106. The out-of-plane motion caused by each C-beam on a side is cancelled out by its symmetric counterpart. Thus, the quadrature error induced on each beam can be locally cancelled.

Additional Notes and Examples

In Example 1, an inertial measurement system includes a device layer including a single proof-mass 3-axis gyroscope formed in an x-y plane, the single proof-mass 3-axis gyroscope including a main proof-mass section suspended about a single, central anchor, the main proof-mass section including a radial portion extending outward towards an edge of the 3-axis gyroscope sensor, a central suspension system configured to suspend the 3-axis gyroscope from the single, central anchor, a drive electrode including a moving portion and a stationary portion, the moving portion coupled to the radial portion, wherein the drive electrode and the central suspension system are configured to oscillate the 3-axis gyroscope about a z-axis normal to the x-y plane at a drive frequency, a cap wafer bonded to a first surface of the device layer, and a via wafer bonded to a second surface of the device layer, wherein the cap wafer and the via wafer are configured to encapsulate the single proof-mass 3-axis gyroscope.

In Example 2, Example 1 optionally includes symmetrical x-axis proof-mass sections configured to move anti-phase along the x-axis in response to z-axis angular motion.

In Example 3, any one or more of Examples 1-2 optionally includes a z-axis gyroscope coupling flexure bearing configured to couple the x-axis proof mass sections and to resist in-phase motion between the x-axis proof mass sections.

In Example 4, any one or more of Examples 1-3 optionally includes electrodes out-of-plane with the device layer and configured to detect x-axis angular rotation and y-axis angular rotation.

In Example 5, the out-of-plane electrodes of one or more of Examples 1-4 are optionally located on the via wafer.

In Example 6, the drive electrode of one or more of Examples 1-5 optionally includes a plurality of moving fingers interdigitated with a plurality of stationary fingers, and wherein the stationary fingers are anchored to the via wafer.

In Example 7, the device layer of one or more of Examples 1-6 optionally includes a 3-axis accelerometer formed adjacent the 3-axis gyroscope in the x-y plane, wherein the cap wafer and the via wafer are configured to encapsulate the 3-axis accelerometer and the 3-axis gyroscope in the same cavity.

In Example 8, the device layer of one or more of Examples 1-7 optionally includes a single proof-mass 3-axis accelerometer formed in the x-y plane, the single proof-mass 3-axis accelerometer suspended about a single, central anchor, the single proof-mass 3-axis accelerometer including separate x, y, and z-axis flexure bearings, wherein the x and y-axis flexure bearings are symmetrical about the single, central anchor and the z-axis flexure is not symmetrical about the single, central anchor.

In Example 9, the cap wafer and the via wafer of one or more of Examples 1-8 are optionally configured to encapsulate the 3-axis accelerometer and the 3-axis gyroscope in the same cavity.

In Example 10, the 3-axis accelerometer of one or more of Examples 1-9 optionally includes in-plane x and y-axis accelerometer sense electrodes.

In Example 11, the in-plane x and y-axis accelerometer sense electrodes of one or more of Examples 1-10 are optionally symmetrical about the single, central anchor.

In Example 12, the 3-axis accelerometer of one or more of Examples 1-11 optionally includes out-of-plane z-axis accelerometer sense electrodes.

In Example 13, the 3-axis accelerometer of one or more of Examples 1-12 is optionally rectangular in shape, longer about the y-axis than the x or z-axis.

In Example 14, the x, y, and z-axis flexure bearings of one or more of Examples 1-13 optionally have high out-of-plane stiffness.

In Example 15, the single proof-mass of one or more of Examples 1-14 optionally includes an outer portion surrounding in-plane x and y-axis accelerometer sense electrodes and x, y, and z-axis flexure bearings.

In Example 16, a micromachined, monolithic inertial sensor apparatus includes a single proof-mass 3-axis gyroscope formed in an x-y plane of a device layer, the single proof-mass 3-axis gyroscope including a main proof-mass section suspended about a single, central anchor, the main proof-mass section including a radial portion extending outward towards an edge of the 3-axis gyroscope, a central suspension system configured to suspend the 3-axis gyroscope from the single, central anchor, and a drive electrode including a moving portion and a stationary portion, the moving portion coupled to the radial portion, wherein the drive electrode and the central suspension system are configured to oscillate the 3-axis gyroscope about a z-axis normal to the x-y plane at a drive frequency.

In Example 17, one or more of Examples 1-16 optionally includes symmetrical x-axis proof-mass sections configured to move anti-phase along the x-axis in response to z-axis angular motion.

In Example 18, one or more of Examples 1-17 optionally includes a single proof-mass 3-axis accelerometer formed in the x-y plane of the device layer adjacent the 3-axis gyroscope, suspended about a single, central anchor, the single proof-mass 3-axis accelerometer including separate x, y, and z-axis flexure bearings, wherein the x and y-axis flexure bearings are symmetrical about the single, central anchor and the z-axis flexure is not symmetrical about the single, central anchor.

In Example 19, the 3-axis accelerometer of one or more of Examples 1-18 optionally includes in-plane x and y-axis accelerometer sense electrodes symmetrical about the single, central anchor, and out-of-plane z-axis accelerometer sense electrodes.

In Example 20, one or more of Examples 1-19 optionally includes a cap wafer bonded to a first surface of the device layer and a via wafer bonded to a second surface of the device layer, wherein the cap wafer and the via wafer are configured to encapsulate the 3-axis gyroscope and the 3-axis accelerometer in the same cavity.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form apart of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc, are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An inertial measurement system, comprising:
    a device layer including:
        a 3-axis gyroscope including a single proof mass formed in an x-y plane of a device layer, the single proof mass of the 3-axis gyroscope including:
            symmetrical x-axis proof mass sections; and
            a z-axis gyroscope coupling flexure coupled to the symmetric x-axis proof mass sections;
        a sense electrode included within the single proof mass of the 3-axis gyroscope; and
        a 3-axis accelerometer including a single proof mass formed in the x-y plane of the device layer adjacent the 3-axis gyroscope,
    the 3-axis gyroscope including a central suspension configured to suspend the single proof mass of the 3-axis gyroscope about a single, central gyroscope anchor, and
    the 3-axis accelerometer including separate x, y, and z-axis flexure bearings configured to suspend a single proof mass of the 3-axis accelerometer about a single, central accelerometer anchor.

2. The system of claim 1, including:
    a cap wafer bonded to a first surface of the device layer; and
    a via wafer bonded to a second surface of the device layer, wherein the cap wafer and the via wafer are configured to encapsulate the 3-axis accelerometer and the 3-axis gyroscope in the same cavity.

3. The system of claim 1, including a via wafer bonded to a perimeter of a surface of the device layer, and
    wherein the single proof masses of the 3-axis gyroscope and the 3-axis accelerometer are anchored to the via wafer using the single, central gyroscope anchor and the single, central accelerometer anchor.

4. The system of claim 1, wherein the 3-axis gyroscope includes:
    a drive electrode including a moving portion and a stationary portion, the moving portion coupled to the single proof mass of the 3-axis gyroscope, wherein the drive electrode and the central suspension are configured to oscillate the 3-axis gyroscope about a z-axis normal to the x-y plane at a drive frequency.

5. The system of claim 1, wherein the x and y-axis flexure bearings are symmetrical about the single, central accelerometer anchor and the z-axis flexure is not symmetrical about the single, central accelerometer anchor.

6. The system of claim 1, wherein the symmetrical x-axis proof mass sections are configured to move anti-phase along an x-axis of the x-y plane in response to a z-axis angular motion.

7. The system of claim 6, wherein the z-axis gyroscope coupling flexure bearing is configured to couple the symmetric x-axis proof mass sections and to resist in-phase motion between the x-axis proof mass sections.

8. The system of claim 1, including:
    a via wafer bonded to a surface of the device layer, the via wafer including:
        x-axis and y-axis gyroscope sense electrodes out-of-plane with the device layer configured to detect x-axis and y-axis angular rotation of the single proof mass of the 3-axis gyroscope; and
        z-axis accelerometer sense electrodes out-of-plane with the device layer configured to detect z-axis acceleration of the single proof mass of the 3-axis accelerometer; and wherein the sense electrode includes a z-axis gyroscope sense electrode, the device layer includes:
x-axis and y-axis accelerometer sense electrodes in-plane with the device layer and configured to detect x-axis and y-axis acceleration of the single proof mass of the 3-axis accelerometer; and
the z-axis gyroscope sense electrodes in-plane with the device layer and configured to detect z-axis angular rotation of the single proof mass of the 3-axis gyroscope.

9. An inertial measurement system, comprising:
a device layer including:
a 3-axis gyroscope including a single proof mass formed in an x-y plane of a device layer, the single proof mass of the 3-axis gyroscope including:
symmetrical x-axis proof mass sections; and
a z-axis gyroscope coupling flexure coupled to the symmetric x-axis proof sections;
a drive electrode included in the single proof mass of the 3-axis gyroscope; and
a 3-axis accelerometer including a single proof mass formed in the x-y plane of the device layer adjacent the 3-axis gyroscope;
a cap wafer bonded to a first surface of the device layer; and
a via wafer bonded to a second surface of the device layer,
the 3-axis gyroscope including a central suspension configured to suspend the single proof mass of the 3-axis gyroscope about a single, central gyroscope anchor,
the 3-axis accelerometer including separate x, y, and z-axis flexure bearings configured to suspend a single proof mass of the 3-axis accelerometer about a single, central accelerometer anchor, and
the cap wafer and the via wafer being configured to encapsulate the 3-axis accelerometer and the 3-axis gyroscope in the same cavity.

10. The system of claim 9, wherein the via wafer is bonded to a perimeter of the second surface of the device layer, and
wherein the single proof masses of the 3-axis gyroscope and the 3-axis accelerometer are anchored to the via wafer using the single, central gyroscope anchor and the single, central accelerometer anchor.

11. The system of claim 9, wherein the symmetrical x-axis proof mass sections are configured to move anti-phase along an x-axis of the x-y plane in response to a z-axis angular motion.

12. The system of claim 11, wherein the z-axis gyroscope coupling flexure bearing is configured to couple the x-axis proof mass sections and to resist in-phase motion between the x-axis proof mass sections.

13. The system of claim 9, including:
a via wafer bonded to a surface of the device layer, the via wafer including:
x-axis and y-axis gyroscope sense electrodes out-of-plane with the device layer configured to detect x-axis and y-axis angular rotation of the single proof mass of the 3-axis gyroscope; and
z-axis accelerometer sense electrodes out-of-plane with the device layer configured to detect z-axis acceleration of the single proof mass of the 3-axis accelerometer; and
wherein the device layer includes:
x-axis and y-axis accelerometer sense electrodes in-plane with the device layer and configured to detect x-axis and y-axis acceleration of the single proof mass of the 3-axis accelerometer; and
a z-axis gyroscope sense electrode in-plane with the device layer and configured to detect z-axis angular rotation of the single proof mass of the 3-axis gyroscope.

14. The system of claim 9, wherein the drive electrode includes a moving portion and a stationary portion, the moving portion is coupled to the single proof mass of the 3-axis gyroscope, the drive electrode and the central suspension are configured to oscillate the 3-axis gyroscope about a z-axis normal to the x-y plane at a drive frequency.

15. The system of claim 9, wherein the x- and y-axis flexure bearings are symmetrical about the single, central accelerometer anchor and the z-axis flexure is not symmetrical about the single, central accelerometer anchor.

16. The system of claim 9, wherein the single proof mass of the 3-axis gyroscope includes symmetrical x-axis proof mass sections configured to move anti-phase along an x-axis of the x-y plane in response to a z-axis angular motion.

17. An inertial measurement system, comprising:
a device layer including:
a 3-axis gyroscope including a single proof mass formed in an x-y plane of a device layer, the single proof mass of the 3-axis gyroscope including:
symmetrical x-axis proof mass sections; and
a z-axis gyroscope coupling flexure coupled to the symmetric x-axis proof sections;
a drive electrode included in the single proof mass of the 3-axis gyroscope; and
a 3-axis accelerometer including a single proof mass formed in the x-y plane of the device layer adjacent the 3-axis gyroscope;
a cap wafer bonded to a first surface of the device layer; and
a via wafer bonded to a second surface of the device layer,
the cap wafer and the via wafer being configured to encapsulate the 3-axis accelerometer and the 3-axis gyroscope in the same cavity.

18. The system of claim 17, wherein the 3-axis gyroscope includes a central suspension configured to suspend the single proof mass of the 3-axis gyroscope about a single, central gyroscope anchor, and
wherein the 3-axis accelerometer including separate x-, y-, and z-axis flexure bearings is configured to suspend a single proof mass of the 3-axis accelerometer about a single, central accelerometer anchor.

19. The system of claim 18, wherein the via wafer is bonded to a perimeter of the second surface of the device layer, and
wherein the single proof masses of the 3-axis gyroscope and the 3-axis accelerometer are anchored to the via wafer using the single, central gyroscope anchor and the single, central accelerometer anchor.

20. The system of claim 17, wherein:
the symmetrical x-axis proof mass sections are configured to move anti-phase along an x-axis of the x-y plane in response to a z-axis angular motion; and
the z-axis gyroscope coupling flexure bearing is configured to couple the x-axis proof mass sections and to resist in-phase motion between the x-axis proof mass sections.

* * * * *